(12) United States Patent
Park et al.

(10) Patent No.: US 11,417,711 B2
(45) Date of Patent: Aug. 16, 2022

(54) ELECTRONIC APPARATUS WITH IMPROVED RELIABILITY

(71) Applicant: Samsung Display Co., Ltd., Yongin-si (KR)

(72) Inventors: Seunghyun Park, Seoul (KR); Joo-Sun Yoon, Seoul (KR); Yun-Mo Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 126 days.

(21) Appl. No.: 16/810,696

(22) Filed: Mar. 5, 2020

(65) Prior Publication Data

US 2020/0303466 A1 Sep. 24, 2020

(30) Foreign Application Priority Data

Mar. 19, 2019 (KR) .......................... 10-2019-0031275

(51) Int. Cl.
*H01L 27/32* (2006.01)
*H01L 51/52* (2006.01)

(52) U.S. Cl.
CPC ........ *H01L 27/322* (2013.01); *H01L 27/3246* (2013.01); *H01L 27/3272* (2013.01); *H01L 51/5253* (2013.01); *H01L 51/5275* (2013.01)

(58) Field of Classification Search
CPC combination set(s) only.
See application file for complete search history.

(56) References Cited

U.S. PATENT DOCUMENTS

| 8,921,840 | B2 | 12/2014 | Kim et al. | |
|---|---|---|---|---|
| 2010/0219429 | A1* | 9/2010 | Cok | H01L 51/5268 257/89 |
| 2016/0087245 | A1* | 3/2016 | Park | H01L 51/5275 257/40 |
| 2016/0118628 | A1* | 4/2016 | Kang | H01L 51/524 257/40 |

(Continued)

FOREIGN PATENT DOCUMENTS

| JP | 2016-37192 A | 3/2016 |
|---|---|---|
| JP | 2017-156412 A | 9/2017 |

(Continued)

*Primary Examiner* — Nduka E Ojeh
(74) *Attorney, Agent, or Firm* — Lewis Roca Rothgerber Christie LLP

(57) ABSTRACT

An electronic apparatus includes a display panel including a base substrate, a pixel definition layer to define openings, light-emitting devices including light-emitting patterns in the openings, and an encapsulation layer covering the light-emitting device, a cover panel including a window layer, a color filter layer, and a color control layer, the color filter layer being on the window layer, the color control layer being on the color filter layer and including a quantum dot, and a refraction control layer including first refraction patterns, overlapping the light-emitting patterns, respectively, and having a first refractive index, and a second refraction pattern adjacent to the first refraction patterns and having a second refractive index that is lower than the first refractive index, wherein, when measured in a first direction, a largest width of each of the first refraction patterns is larger than a width of each of the light-emitting patterns.

25 Claims, 16 Drawing Sheets

(56) References Cited

U.S. PATENT DOCUMENTS

| | | | |
|---|---|---|---|
| 2016/0164049 A1* | 6/2016 | Choi | H01L 27/322 |
| | | | 438/27 |
| 2016/0178812 A1* | 6/2016 | Gao | G02B 5/003 |
| | | | 257/88 |
| 2018/0190942 A1* | 7/2018 | Song | H01L 51/5275 |

FOREIGN PATENT DOCUMENTS

| | | |
|---|---|---|
| KR | 10-0477128 B1 | 7/2005 |
| KR | 10-2014-0059372 A | 5/2014 |
| KR | 10-2016-0067303 A | 6/2016 |

\* cited by examiner

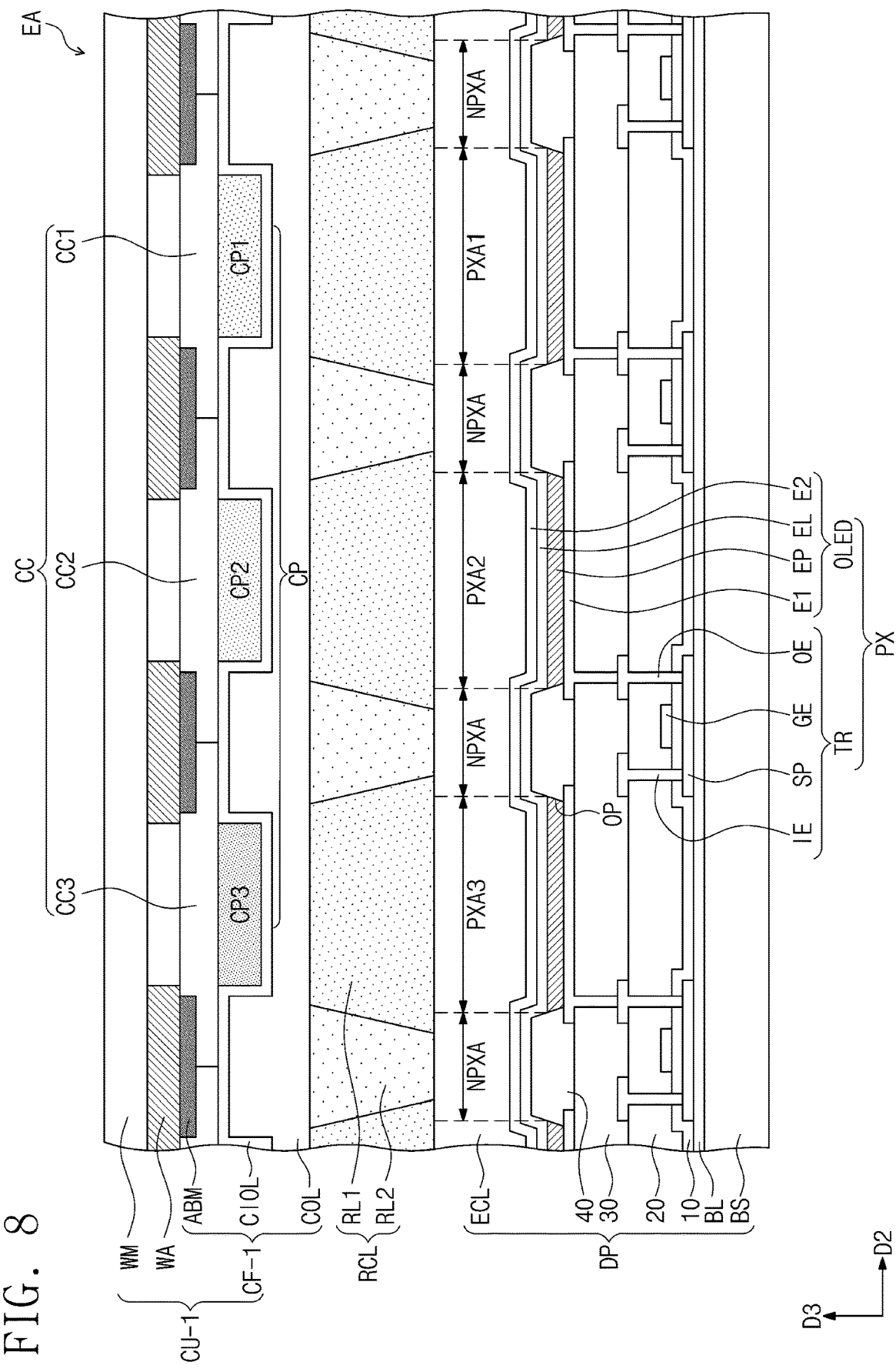

ELECTRONIC APPARATUS WITH IMPROVED RELIABILITY

BACKGROUND

The present disclosure relates to an electronic apparatus with improved reliability.

An electronic apparatus may be activated by an electrical signal. The electronic apparatus includes a display panel for displaying an image. An organic light emitting display panel, which is one type of a number of display panels, has excellent properties, such as low power consumption, high brightness, and high response speed.

The organic light emitting display panel may include red, green, and blue organic light emitting layers, which are located in red, green, and blue pixel regions to emit red, green, and blue lights, respectively. Alternatively, the organic light emitting display panel may include an organic light emitting layer, which is located in the red, green, and blue pixel regions to emit a white light, and may include red, green, and blue color filters, which are provided in the red, green, and blue pixel regions, respectively.

The electronic apparatus includes an active region, on which an image is displayed, and a bezel region, which is adjacent to the active region.

BRIEF DESCRIPTION OF THE DRAWINGS

Embodiments of the present disclosure will be more clearly understood from the following brief description taken in conjunction with the accompanying drawings. The accompanying drawings represent non-limiting, embodiments as described herein.

FIG. 8 is a sectional view illustrating an electronic apparatus according to an embodiment of the present disclosure.

Figure 1:
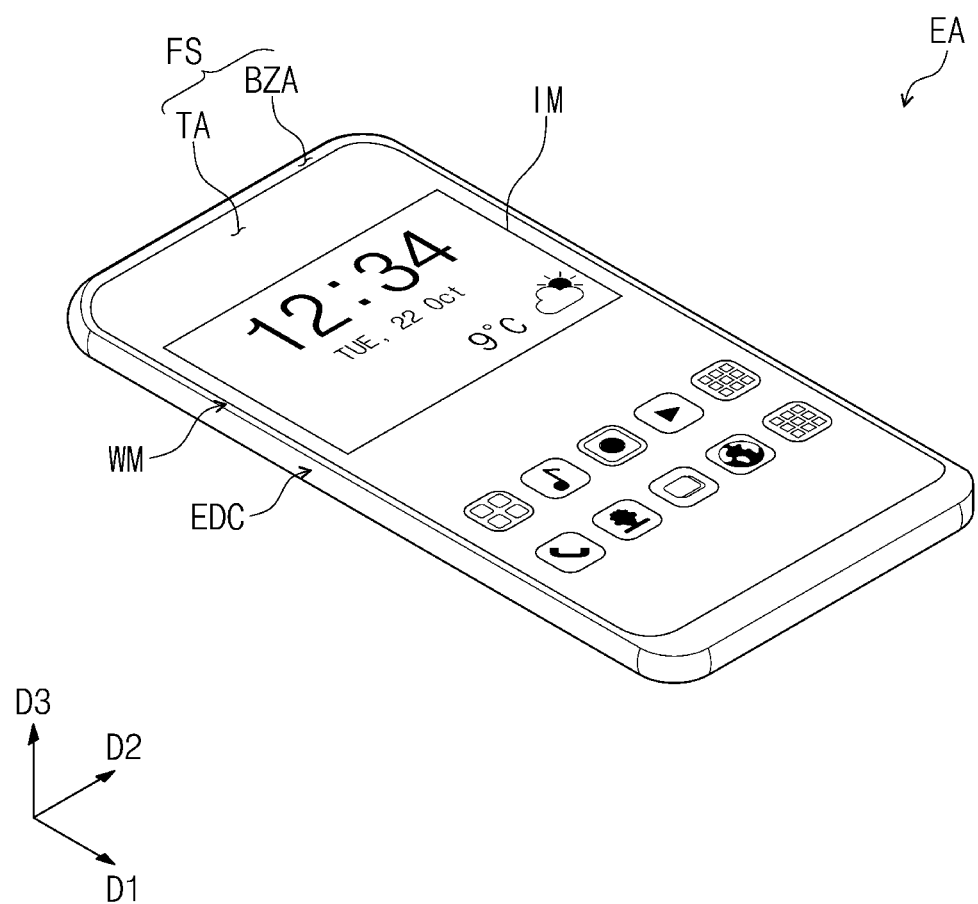
FIG. 1 is a perspective view illustrating a combined structure of an electronic apparatus according to an embodiment of the present disclosure.

It should be noted that these figures are intended to illustrate the general characteristics of methods, structure and/or materials utilized in certain embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the present disclosures will now be described more fully with reference to the accompanying drawings, in which embodiments are shown. Embodiments of the present disclosures may, however, be embodied in many different forms and should not be construed as being limited to the embodiments set forth herein; rather, these embodiments are provided so that this disclosure will be thorough and complete, and will fully convey the concept of embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of embodiments. As used herein, the singular forms "a," "an," and "the" are intended to include the plural forms as well, unless the context clearly indicates otherwise. It will be further understood that the terms "comprises", "comprising", "includes," and/or "including," if used herein, specify the presence of stated features, integers, steps, operations, elements and/or components, but do not preclude the presence or addition of one or more other features, integers, steps, operations, elements, components and/or groups thereof.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Embodiments of the present disclosures are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments of the present disclosures should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which embodiments of the present disclosures belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
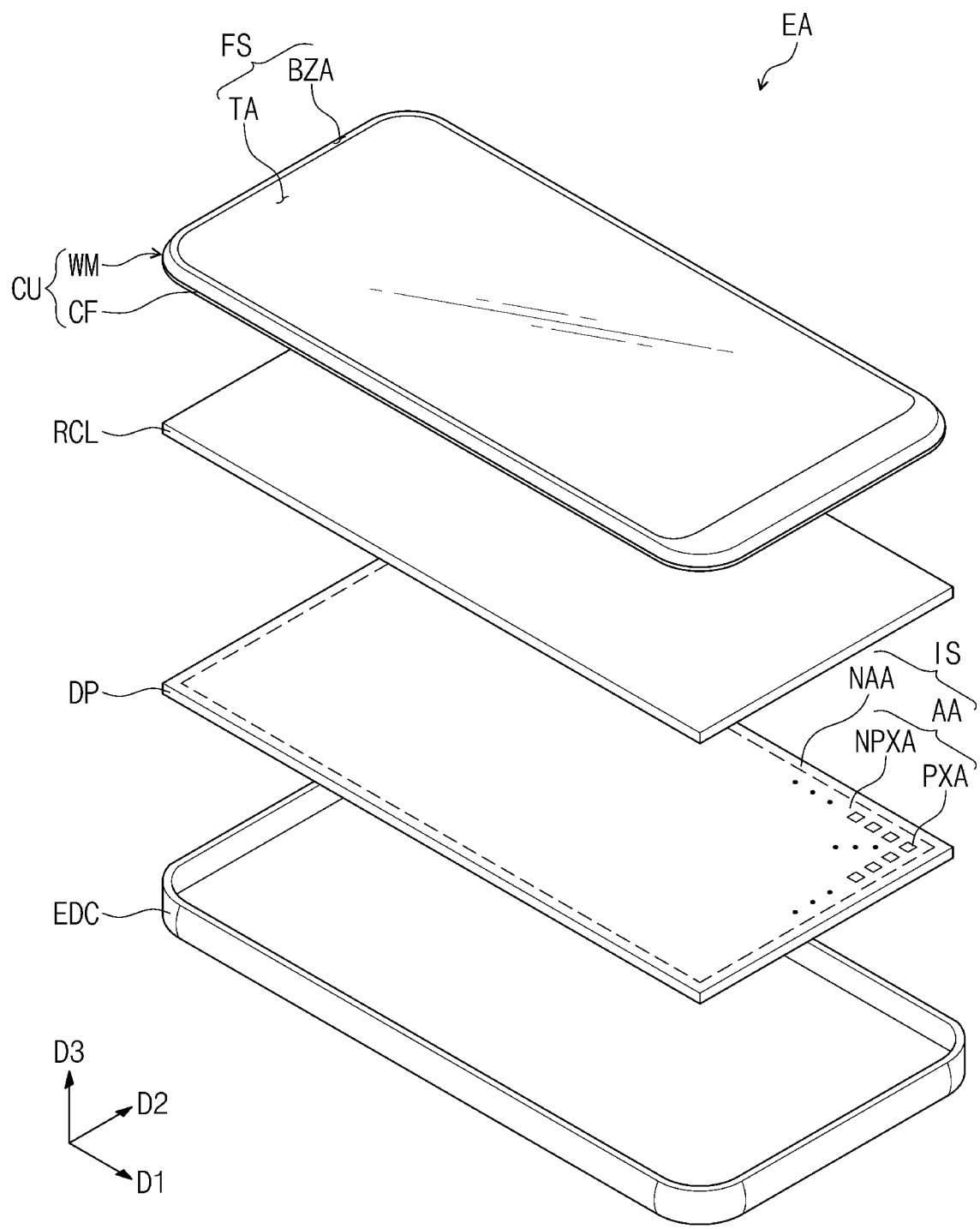
FIG. 2 is an exploded perspective view illustrating an electronic apparatus according to an embodiment of the present disclosure.

FIG. 1 is a perspective view illustrating a combined structure of an electronic apparatus according to an embodiment of the present disclosure. FIG. 2 is an exploded perspective view illustrating an electronic apparatus according to an embodiment of the present disclosure.

Referring to FIGS. 1 and 2, an electronic apparatus EA may display an image IM, which is emitted toward a third direction D3, and which is displayed on a plane defined by a first direction D1 and a second direction D2. The electronic apparatus EA may include a cover panel CU, a refraction control layer RCL, a display panel DP, and a cover case EDC.

The cover panel CU may include a window layer WM and an optical layer CF. The cover panel CU may be located on the refraction control layer RCL to cover the refraction control layer RCL. The window layer WM may include a front surface FS exposed to the outside. The image IM displayed on the display panel DP may be provided to a user through the front surface FS.

The window layer WM may have a single-layered structure or a multi-layered structure. For example, the window layer WM may have a stacking structure including a plurality of plastic films that are coupled to each other by an adhesive layer, or may have a stacking structure including a glass substrate and a plastic film that are coupled to each other by an adhesive layer. The window layer WM may be optically transparent. For example, the window layer WM may include glass or plastic.

The front surface FS of the window layer WM may include a transmission region TA and a bezel region BZA when viewed in a plan view. The transmission region TA may be a region for transmitting light that is provided from the display panel DP. The transmission region TA may have a shape corresponding to an active region AA of the display panel DP. For example, the transmission region TA may overlap an entirety of, or a partial region of, a front surface of the active region AA. Thus, the image IM, which is displayed on the active region AA, may be provided to a user through the transmission region TA.

The bezel region BZA may be a region having a relatively low optical transmittance when compared with the transmission region TA. The bezel region BZA may define a shape of the transmission region TA. The bezel region BZA may be adjacent to the transmission region TA, and may have a closed loop shape enclosing the transmission region TA.

The bezel region BZA may have a color (e.g., a predetermined color). The bezel region BZA may cover a peripheral region NAA of the display panel DP, and may reduce or prevent recognition of the peripheral region NAA by a user. For example, in the case where light generated from the display panel DP is leaked to the peripheral region NAA, the bezel region BZA may block the leaked light, and thus, the peripheral region NAA may be prevented from being recognized by a user.

The display panel DP may display the image IM on a front surface IS. The front surface IS may include the active region AA and the peripheral region NAA. The image IM may be displayed on the active region AA. The peripheral region NAA may be adjacent to the active region AA.

The display panel DP may include a plurality of pixels. The pixels may display lights in response to electrical signals. Each of the pixels may generate light, and such lights emitted from the pixels may form the image IM to be displayed on the active region AA. The active region AA may include light-emitting regions PXA, to which lights from the pixels are provided, and a non-light-emitting region NPXA, which is adjacent to the light-emitting regions PXA.

The cover case EDC may be combined with the cover panel CU. The cover case EDC may have a surface that is used as a rear surface of the electronic apparatus EA. The cover case EDC may be combined with the cover panel CU to define an internal space. Elements of the display panel DP may be contained in the internal space. The cover case EDC may include a material with a given stiffness (e.g., a relatively high stiffness). For example, the cover case EDC may include a plurality of frames and/or plates, each of which is formed of at least one of glass, plastic, or metallic materials. The cover case EDC may stably protect elements constituting the electronic apparatus EA, which are contained in the internal space, from an external impact.

Figure 3:
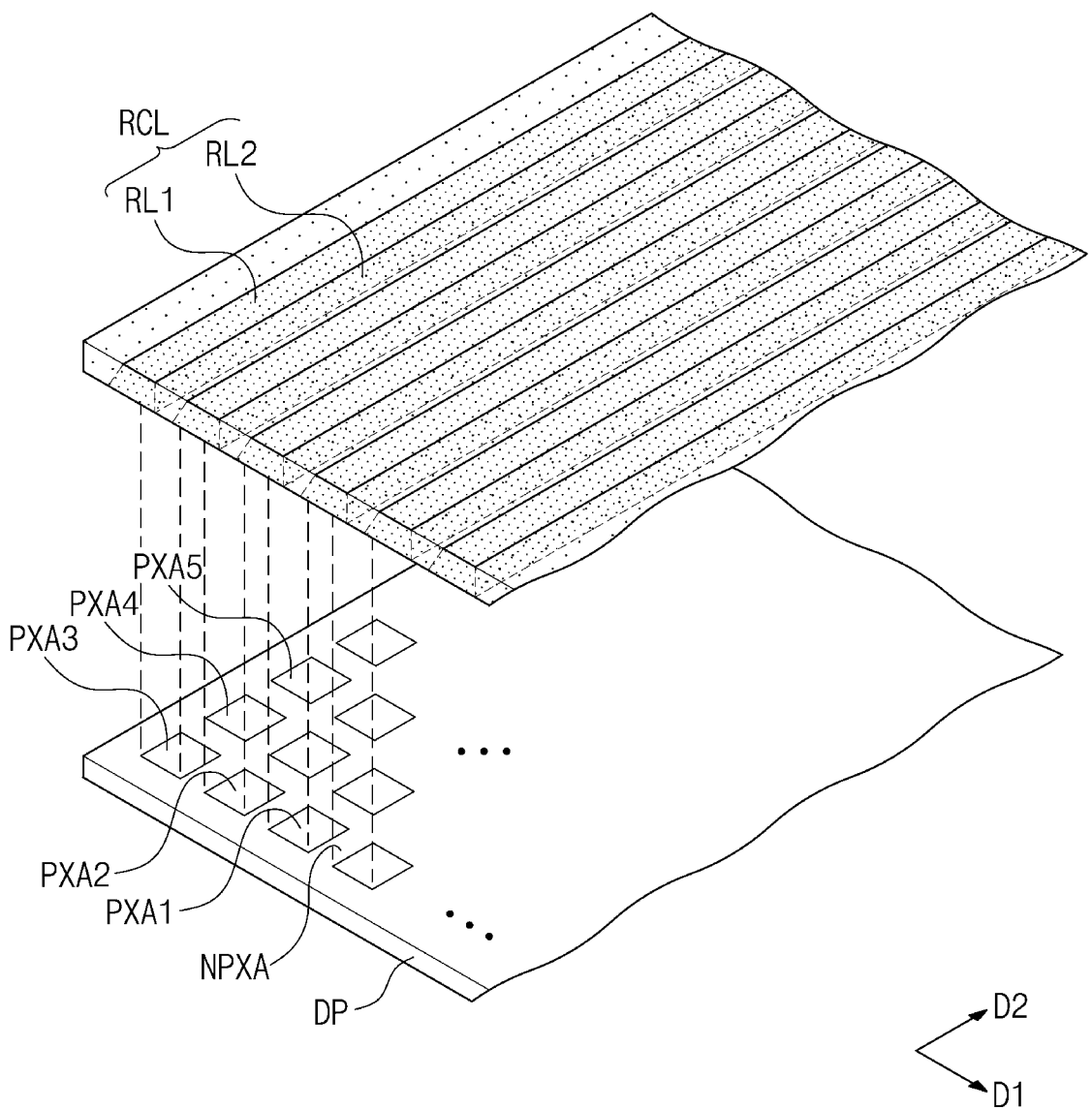
FIG. 3 is an exploded perspective view illustrating some elements of an electronic apparatus according to an embodiment of the present disclosure.
Figure 4A:
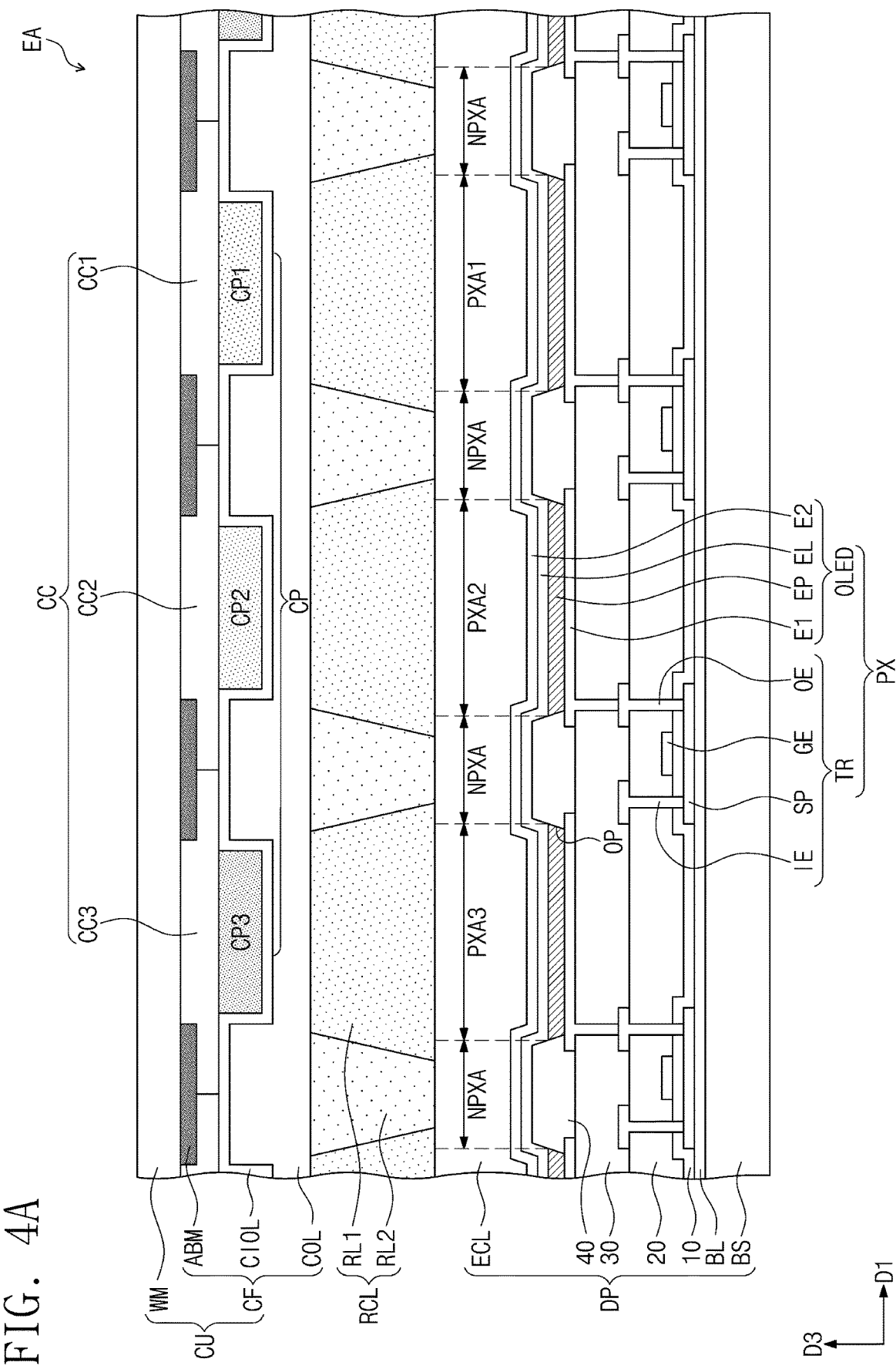
FIG. 4A is a sectional view illustrating an electronic apparatus according to an embodiment of the present disclosure.
Figure 4B:
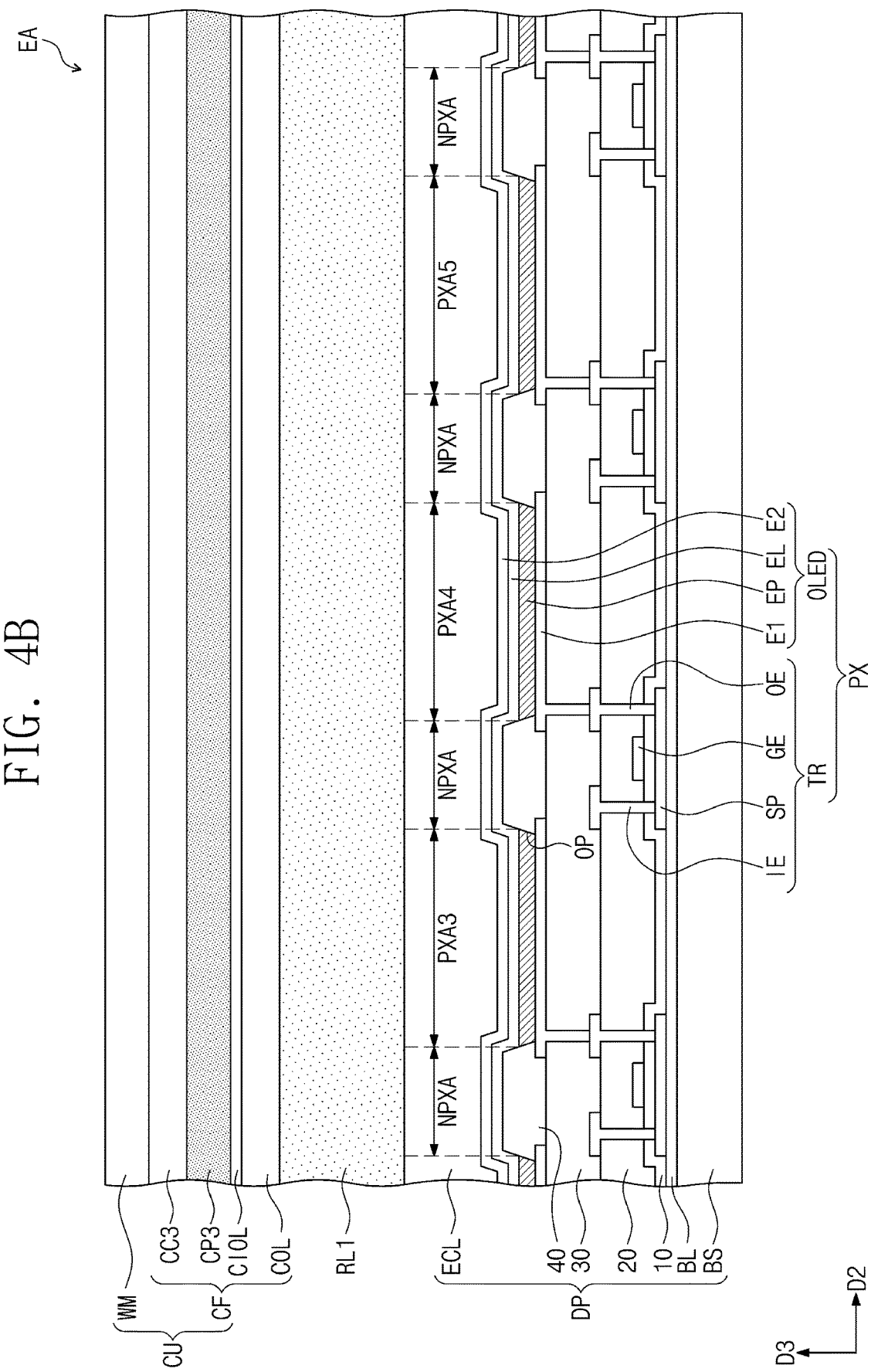
FIG. 4B is a sectional view illustrating an electronic apparatus according to an embodiment of the present disclosure.
Figure 5:
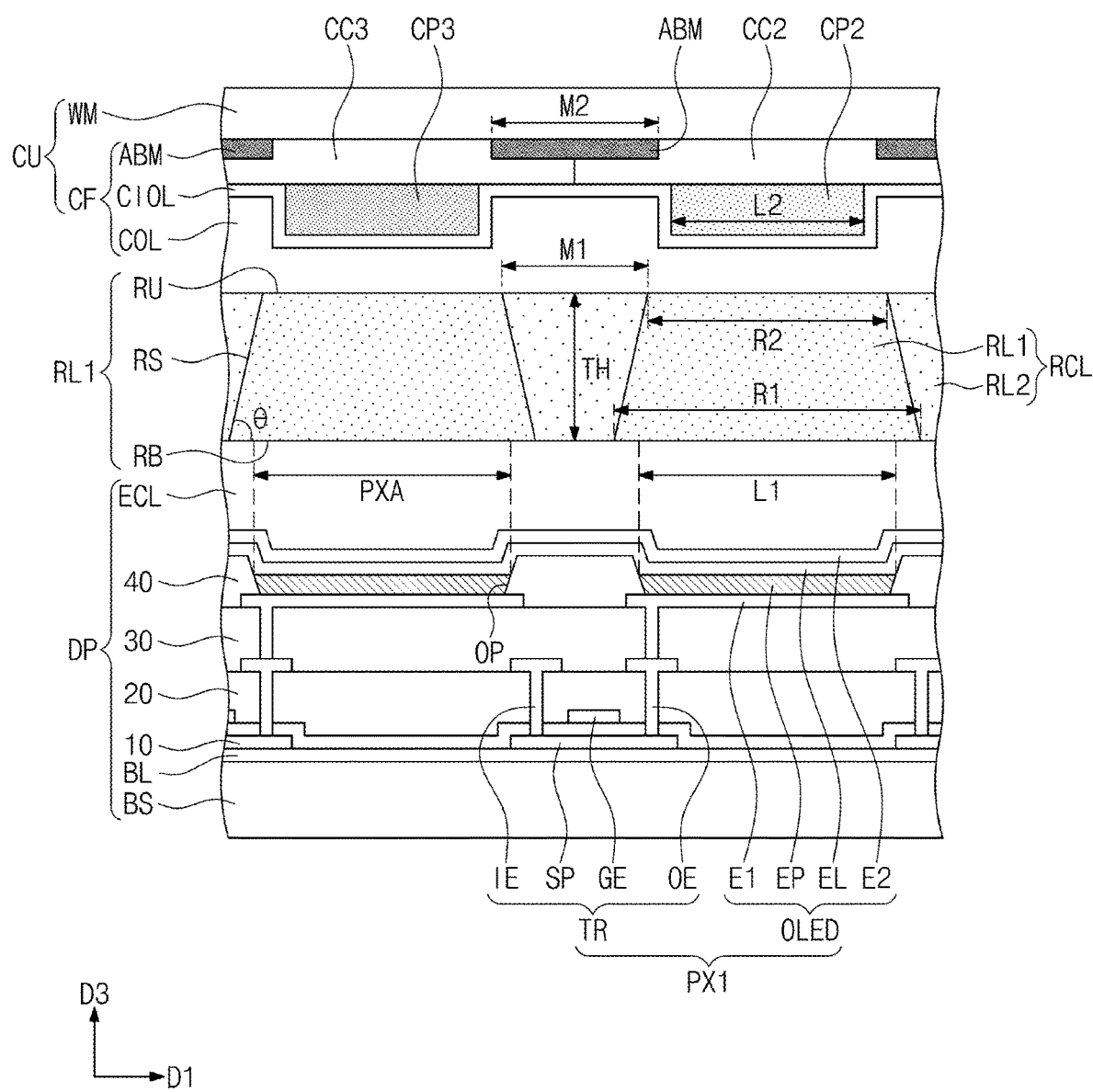
FIG. 5 is an enlarged sectional view of a portion of an electronic apparatus according to an embodiment of the present disclosure.

FIG. 3 is an exploded perspective view illustrating some elements of an electronic apparatus according to an embodiment of the present disclosure. FIG. 4A is a sectional view illustrating an electronic apparatus according to an embodiment of the present disclosure. FIG. 4B is a sectional view illustrating an electronic apparatus according to an embodiment of the present disclosure. FIG. 5 is an enlarged sectional view of a portion of an electronic apparatus according to an embodiment of the present disclosure.

The display panel DP and the refraction control layer RCL, which constitute the electronic apparatus EA of FIG. 2, are illustrated in FIG. 3. In an embodiment, the refraction control layer RCL may include first refraction patterns RL1 and second refraction pattern RL2. For convenience in illustration and description, some (e.g., light-emitting regions PXA1, PXA2, PXA3, PXA4, and PXA5) of the light-emitting regions PXA of FIG. 2 are exemplarily illustrated in FIG. 3.

The refraction control layer RCL may be located on the display panel DP.

The refraction control layer RCL may cover the display panel DP. The first refraction patterns RL1 may be spaced apart from each other in the first direction D1. Each of the first refraction patterns RL1 may extend in the second direction D2. The first refraction patterns RL1 may be located to form a stripe pattern.

In an embodiment, the first refraction patterns RL1 and the second refraction pattern RL2 may be alternately located. For example, the second refraction pattern RL2 may be located between an adjacent pair/adjacent pairs of the first refraction patterns RL1.

Each of the first refraction patterns RL1 may have a frustum. For example, each of the first refraction patterns RL1 may have a frustum shape including a bottom surface, which is adjacent to the light-emitting regions PXA, a top surface, which is opposite to the bottom surface and which has an area that is smaller than that of the bottom surface, and one or more side surfaces connecting the bottom surface to the top surface. The second refraction pattern RL2 may have a frustum shape extending in the second direction D2.

In an embodiment, the light-emitting regions PXA of the display panel DP may be spaced apart from each other in both of the first and second directions D1 and D2. The light-emitting regions PXA may be arranged in a matrix shape on a plane that is defined by the first and second directions D1 and D2.

In an embodiment, each of the first refraction patterns RL1 may overlap some of the light-emitting regions PXA, which are arranged in the second direction D2. The second refraction pattern RL2 may be located between respective ones of the first refraction patterns RL1 that are adjacent to each other in the first direction D1, and thus might not overlap the light-emitting regions PXA.

Referring to FIG. 4A, the display panel DP according to an embodiment of the present disclosure may include a base layer BS, insulating layers BL, 10, 20, 30, and 40, an encapsulation layer ECL, and a pixel PX. FIG. 4A illustrates the pixels PX, which are overlapped with the first to third light-emitting regions PXA1, PXA2, and PXA3 of FIG. 3, and also illustrates elements that are located on the pixels PX.

The base layer BS may be used as an underlying layer, on which elements of the display panel DP are located. The base layer BS may include an insulating material. For example, the base layer BS may include glass, a resin film, or a stack of alternately-stacked organic and inorganic layers.

Each of the pixels PX may generate light, and such lights emitted from the pixels PX may form the image IM to be displayed on the active region AA. Each of the pixels PX may be connected to a plurality of signal lines. For example, signal lines connected to each of the pixels PX may be a gate line or a data line.

An auxiliary layer BL may include an inorganic material. The auxiliary layer BL may include a barrier layer and/or a buffer layer. For example, the auxiliary layer BL may reduce or prevent oxygen or moisture from entering the pixel PX through the base layer BS, and may have a surface energy that is lower than a surface energy of the base layer BS, thereby allowing the pixel PX to be stably formed.

At least one of the base layer BS and the auxiliary layer BL may include a plurality of layers, which are alternately stacked. In an embodiment, at least one of the barrier and buffer layers of the auxiliary layer BL may include a plurality of layers or may be omitted. However, this is just one example of the display panel DP, and in other embodiments, the structure of the display panel DP may be variously changed and is not limited to a specific structure.

Each of the pixels PX may include a transistor TR and an organic light emitting device OLED. The transistor TR may include a semiconductor pattern SP, a control electrode GE, an input electrode IE, and an output electrode OE.

The semiconductor pattern SP may be located on the auxiliary layer BL. The semiconductor pattern SP may include a semiconductor material. For example, the semiconductor pattern SP may include at least one of crystalline semiconductor materials, oxide semiconductor materials, poly silicon, or amorphous silicon.

The control electrode GE may be spaced apart from the semiconductor pattern SP with a first insulating layer 10 interposed therebetween. The control electrode GE may be formed of, or may include, a conductive material. For example, the control electrode GE may be formed of, or may include, at least one of metallic materials, such as nickel (Ni), molybdenum (Mo), aluminum (Al), titanium (Ti), copper (Cu), and tungsten (W), or metal oxide materials.

The input electrode IE and the output electrode OE may be spaced apart from the control electrode GE with a second insulating layer 20 interposed therebetween. The input electrode IE and the output electrode OE may penetrate the first insulating layer 10 and the second insulating layer 20, and may be respectively coupled to two opposite portions of the semiconductor pattern SP.

Each of the input electrode IE and the output electrode OE may include a conductive material. For example, each of the input electrode IE and the output electrode OE may include at least one of nickel (Ni), chromium (Cr), molybdenum (Mo), aluminum (Al), titanium (Ti), copper (Cu), tungsten (W), or alloys thereof. Each of the input electrode IE and the output electrode OE may have a single-layered or multi-layered structure.

A third insulating layer 30 may be located on the second insulating layer 20 to cover the input electrode IE and the output electrode OE. In another embodiment, the semiconductor pattern SP may be located on the control electrode GE. In another embodiment, the semiconductor pattern SP may be located on the input electrode IE and the output electrode OE. In another embodiment, the input electrode IE and the output electrode OE may be located on the same layer below the semiconductor pattern SP, and may be directly coupled to the semiconductor pattern SP. According to some embodiments of the present disclosure, the structure of the transistor TR may be variously changed, and the present disclosure is not limited to a specific structure of the transistor TR.

The organic light emitting device OLED may be located on the third insulating layer 30. The organic light emitting device OLED may include one of various devices capable of emitting light. The organic light emitting device OLED may include a first electrode E1, a light-emitting pattern EP, a control layer EL, and a second electrode E2.

The first electrode E1 may penetrate the third insulating layer 30 and may be coupled to the transistor TR. In other embodiments, the display panel DP may further include an additional connection electrode, which is located between the first electrode E1 and the transistor TR, and in this case, the first electrode E1 may be electrically coupled to the transistor TR through the additional connection electrode.

A fourth insulating layer 40 may be located on the third insulating layer 30. The fourth insulating layer 40 may be formed of, or may include, an organic material and/or an inorganic material and may have a single-layered structure or a stacked structure. An opening OP may be defined in, or by, the fourth insulating layer 40. The opening OP may expose at least a portion of the first electrode E1. The fourth insulating layer 40 may be a pixel definition layer.

The light-emitting pattern EP may be located in the opening OP defined by the fourth insulating layer 40. The light-emitting pattern EP may be located on the first electrode E1 exposed by the opening OP. The light-emitting pattern EP may include a light-emitting material. For example, the light-emitting pattern EP may include at least one of materials capable of emitting red, green, and blue lights, and may include a fluorescent or phosphorescent material. The light-emitting pattern EP may include an organic or inorganic light emitting material. The light-emitting pattern EP may emit a light in response to a potential difference between the first electrode E1 and the second electrode E2.

According to an embodiment of the present disclosure, the light-emitting pattern EP may include a quantum dot material. A core of the quantum dot may be selected from the group consisting of II-VI compounds, III-V compounds, IV-VI compounds, IV elements, IV compounds, and/or combinations thereof.

The II-VI compounds may be selected from the group consisting of binary compounds (e.g., including CdSe, CdTe, ZnS, ZnSe, ZnTe, ZnO, HgS, HgSe, HgTe, MgSe, and/or MgS), mixtures of the binary compounds, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and/or HgZnSTe), and/or mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and/or InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InNP, InNAs, InNSb, InPAs, and/or InPSb), mixtures of the ternary compounds, quaternary compounds (e.g., including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb), and/or mixtures of the quaternary compounds.

The IV-VI compounds may be selected from the group consisting of binary compounds (e.g., including SnS, SnSe, SnTe, PbS, PbSe, and/or PbTe), mixtures of the binary compounds, ternary compounds (e.g., including SnSeS, SnSeTe, SnSTe, PbSeS, PbSeTe, PbSTe, SnPbS, SnPbSe, and/or SnPbTe), mixtures of the ternary compounds, quaternary compounds (e.g., including SnPbSSe, SnPbSeTe, and/or SnPbSTe), and/or mixtures of the quaternary compounds. The IV elements may be selected from the group consisting of Si, Ge, and/or mixtures thereof. The IV compounds may include binary compounds selected from the group consisting of SiC, SiGe, and/or mixtures thereof.

Here, the binary, ternary, or quaternary compound may have a uniform concentration throughout the particle or may have a spatially varying concentration distribution in each particle. In an embodiment, each of the quantum dots may have a core/shell structure, in which one quantum dot is enclosed by another quantum dot. At an interface between the core and the shell, an element contained in the shell may have a concentration gradient decreasing in a central direction.

In an embodiment, the quantum dot may have a core-shell structure, which includes a core containing the aforementioned nanocrystal and a shell surrounding the core. The shell of the quantum dot may be used as a protection layer, which prevents chemical characteristics of the core from being changed and preserves the semiconductor property of the core, and/or may be used as a charging layer, which allows the quantum dot to have an electrophoresis property. The shell may be a single layer or a multiple layer. At an interface between the core and the shell, an element contained in the shell may have a concentration gradient decreasing in a central direction. For example, the shell of the quantum dot may be formed of, or may include, oxide compounds of metallic or nonmetallic elements, semiconductor compounds, or any combination thereof.

For example, the oxide compounds of metallic or nonmetallic elements may include binary compounds (e.g., $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO) and ternary compounds (e.g., $MgAl_2O_4$, $CoFe_2O_4$, $NiFe_2O_4$, and $CoMn_2O_4$), but the present disclosure is not limited to these examples.

In addition, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the present disclosure is not limited to these examples.

Each of the quantum dots may have a light-emitting wavelength spectrum whose full width half maximum (FWHM) is less than about 45 nm (for example, less than about 40 nm or less than about 30 nm), and in this case, it may be possible to realize improved color purity or color reproduction characteristics. Furthermore, the quantum dots may allow light to be emitted radially, and thus, it may be possible to improve a viewing angle property.

In an embodiment, the quantum dots may be a spherical, pyramid-shaped, multi-arm, or cubic nano particle. In another embodiment, the quantum dots may be a nano tube, a nano wire, a nano fiber, a nano plate-shaped particle, but the present disclosure is not limited to these examples.

A wavelength or color of light emitted from the quantum dot may be determined by a particle size of the quantum dot, and by providing quantum dots of various sizes, it may be possible to realize various colors (e.g., blue, red, and green).

In an embodiment, the light-emitting regions PXA1, PXA2, and PXA3 may be defined as regions, each of which is overlapped with the light-emitting pattern EP in each of the pixels PX. In other words, the light-emitting regions PXA of FIG. 3 may have a shape corresponding to that of the light-emitting pattern EP, which is located in the opening OP of the fourth insulating layer 40. Thus, the light-emitting patterns EP according to an embodiment of the present disclosure may be arranged in a matrix shape. The light-emitting pattern EP may include an organic material. In the case where the area of the light-emitting pattern EP is increased, it may be possible to increase light-emitting efficiency and life span of the light-emitting pattern EP.

The control layer EL may be located between the first electrode E1 and the second electrode E2. The control layer EL may be located adjacent to the light-emitting pattern EP. The control layer EL may control the movement of electric charges to improve light-emitting efficiency and life span of the organic light emitting device OLED. The control layer EL may include at least one of a hole transport material, a hole injection material, an electron transport material, or an electron injection material.

In the present embodiment, the control layer EL is illustrated to be located between the light-emitting pattern EP and the second electrode E2. However, the present disclosure is not limited to this example, and in another embodiment, the control layer EL may be located between the light-emitting pattern EP and the first electrode E1, or may include a plurality of layers that are stacked in the third direction D3 with the light-emitting pattern EP interposed therebetween. In the organic light emitting device OLED according to an embodiment, the control layer EL may be omitted.

The control layer EL may be a single body that is extended from the active region AA (e.g., see FIG. 2) to the peripheral region NAA (e.g., see FIG. 2). The control layer EL may be provided in common for a plurality of pixels.

The second electrode E2 may be located on the control layer EL. The second electrode E2 may be located to face the first electrode E1. The second electrode E2 may be a single body/common electrode that is extended from the active region AA (e.g., see FIG. 2) to the peripheral region NAA (e.g., see FIG. 2). The second electrode E2 may be provided in common for the plurality of pixels PX. The organic light emitting device OLED, which is located in each of the pixels PX, may receive a common power voltage through the second electrode E2.

The second electrode E2 may be formed of, or may include, a transparent conductive material or a transflective conductive material. Thus, light generated by the light-emitting pattern EP may easily pass through the second electrode E2 to propagate in the third direction D3. However, the present disclosure is not limited to this example or to any specific embodiment, and in another embodiment, the organic light emitting device OLED may be designed to have a back-side emission structure, in which the first electrode E1 includes a transparent or transflective material, or may be designed to have a double-side emission structure, in which light is emitted through top and bottom surfaces thereof.

The encapsulation layer ECL may be located on the organic light emitting device OLED to seal or encapsulate the organic light emitting device OLED. The encapsulation layer ECL may be provided in common on the plurality of pixels PX. In other embodiments, a capping layer covering the second electrode E2 may be further located between the second electrode E2 and the encapsulation layer ECL.

The encapsulation layer ECL may include at least one inorganic encapsulation layer, and an organic encapsulation layer that is in contact with the inorganic encapsulation layer. In an embodiment, the refraction control layer RCL may be in contact with one of the inorganic encapsulation layer and the organic encapsulation layer.

In an embodiment, the refraction control layer RCL may be located on the encapsulation layer ECL. The first refraction patterns RL1 may be spaced apart from each other in the first direction D1. The second refraction pattern RL2 may be located between the first refraction patterns RL1 that are spaced apart from each other.

Each of the first refraction patterns RL1 may overlap with a corresponding one of the light-emitting regions PXA. For example, the first refraction patterns RL1 may respectively overlap the light-emitting regions PXA1, PXA2, and PXA3, which are spaced apart from each other in the first direction D1. Each of the first refraction patterns RL1 may have a trapezoidal shape when viewed in a section view/cross-sectional view defined by the first and third directions D1 and D3.

The second refraction pattern RL2 may be located between adjacent ones of the first refraction patterns RL1. When viewed in a sectional view, the second refraction pattern RL2 may overlap with the non-light-emitting region NPXA, which is formed between the light-emitting regions PXA1, PXA2, and PXA3. The second refraction pattern RL2 may have an inverse-trapezoidal shape between an adjacent pair of the first refraction patterns RL1.

The cover panel CU may include the window layer WM and the optical layer CF. The optical layer CF may include a light-blocking layer ABM, a color filter layer CC, a color control layer CP, an inorganic cover layer CIOL, and an organic cover layer COL.

The light-blocking layer ABM may be located on a rear surface of the window layer WM. The light-blocking layer ABM may overlap with the non-light-emitting region NPXA. The light-blocking layer ABM may have a shape corresponding to that of the non-light-emitting region NPXA shown in FIG. 3. The light-blocking layer ABM may have a specific color to absorb a leaked light. For example, the light-blocking layer ABM may be black.

In an embodiment, the light-blocking layer ABM may include an optically opaque material. For example, the light-blocking layer ABM may include at least one of metallic particles whose metallic element includes at least one of chromium (Cr), silver (Ag), molybdenum (Mo), nickel (Ni), titanium (Ti), or tantalum (Ta), oxides of the metallic particles, or organic materials.

The color filter layer CC may include first to third color patterns CC1, CC2, and CC3. The color filter layer CC may be located on the rear surface of the window layer WM. A portion of each of the first to third color patterns CC1, CC2, and CC3 may cover the light-blocking layer ABM. At least a portion of each of the first to third color patterns CC1, CC2, and CC3 may overlap a corresponding one of the light-emitting regions PXA1, PXA2, and PXA3.

The first to third color patterns CC1, CC2, and CC3 may block or transmit lights of different colors. For example, the first color pattern CC1 may transmit only blue light. For example, the second color pattern CC2 may transmit only red light while blocking the blue light. For example, the third color pattern CC3 may transmit only green light while blocking the blue light.

The first to third color patterns CC1, CC2, and CC3 may include organic materials that block lights of different colors, respectively. The first to third color patterns CC1, CC2, and CC3 may have different colors. For example, the first color pattern CC1 may be blue, the second color pattern CC2 may be red, and the third color pattern CC3 may be green.

The color control layer CP may improve color reproduction characteristics of the display panel DP. The color control layer CP may include first to third control patterns CP1, CP2, and CP3. Each of the first to third control patterns CP1, CP2, and CP3 may overlap a corresponding one of the first to third color patterns CC1, CC2, and CC3. For example, the first control pattern CP1 may be located on the first color pattern CC1, the second control pattern CP2 may be located on the second color pattern CC2, and the third control pattern CP3 may be located on the third color pattern CC3.

In an embodiment, the first control pattern CP1 may display the same color as that of light provided from the display panel DP. For example, the blue light generated by the display panel DP may pass through the first control pattern CP1 without any change in its optical characteristics.

The first control pattern CP1, which corresponds to a region emitting the blue light, may include a material that does not include fluorescent bodies or quantum dots and that transmits the blue light incident thereto. The first control pattern CP1 may further include an element causing scattering of an incident light. For example, the first control pattern CP1 may include at least one of titanium oxide ($TiO_2$), polymer (e.g., photo-sensitive resin), blue dye, or blue pigment, but the present disclosure is not limited to this example. For example, if a material does not cause a change in color of the blue light, it may be used for the first control pattern CP1.

Each of the second control pattern CP2 and the third control pattern CP3 may include a quantum dot material, which causes a change in optical characteristics (e.g., wavelength or color) of an incident light. A core of the quantum dot may be selected from the group consisting of II-VI compounds, III-V compounds, IV-VI compounds, IV elements, IV compounds, and combinations thereof.

The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InNP, InNAs, InNSb, InPAs, and InPSb), mixtures of the ternary compounds, quaternary compounds (e.g., including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected from the group consisting of Si, Ge, and mixtures thereof. The IV compounds may include binary compounds selected from the group consisting of SiC, SiGe, and mixtures thereof.

Here, the binary, ternary, or quaternary compound may have a uniform concentration throughout the particle, or may have a spatially varying concentration distribution in each particle. In an embodiment, each of the quantum dots may have a core/shell structure in which one quantum dot is enclosed by another quantum dot. At an interface between the core and the shell, an element contained in the shell may have a concentration gradient decreasing in a central direction.

In an embodiment, the quantum dot may have a core-shell structure, which includes a core containing the aforementioned nanocrystal and a shell surrounding the core. The shell of the quantum dot may be used as a protection layer, which prevents chemical characteristics of the core from being changed, and which preserves the semiconductor property of the core, and/or may be used as a charging layer, which allows the quantum dot to have an electrophoresis property. The shell may be a single layer or a multiple layer. At an interface between the core and the shell, an element contained in the shell may have a concentration gradient decreasing in a central direction. For example, the shell of the quantum dot may be formed of, or may include, oxide compounds of metallic or nonmetallic elements, semiconductor compounds, or any combination thereof.

For example, the oxide compounds of metallic or nonmetallic elements may include binary compounds (e.g., $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$) and ternary compounds (e.g., $MgAl_2O_4$, $CoFe_2O_4$, $NiFe_2O_4$, and $CoMn_2O_4$), but the present disclosure is not limited to these examples.

In addition, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the present disclosure is not limited to these examples.

Each of the quantum dots may have a light-emitting wavelength spectrum whose full width half maximum (FWHM) is less than about 45 nm (for example, less than about 40 nm or less than about 30 nm), and in this case, it may be possible to realize improved color purity or color reproduction characteristics. Furthermore, the quantum dots may allow light to be emitted radially, and thus, it may be possible to improve a viewing angle property.

In an embodiment, the quantum dots may be a spherical, pyramid-shaped, multi-arm, or cubic nano particle. In another embodiment, the quantum dots may be a nano tube, a nano wire, a nano fiber, a nano plate-shaped particle, but the present disclosure is not limited to these examples.

A wavelength or color of light emitted from the quantum dot may be determined by a particle size of the quantum dot. By providing quantum dots of various sizes, it may be possible to realize various colors (e.g., blue, red, and green).

Each of the second control pattern CP2 and the third control pattern CP3 may include a plurality of fluorescent bodies or phosphors, which convert an incident light to different lights. For example, the second control pattern CP2 may include a plurality of fluorescent bodies or phosphors that absorb a blue light emitted from the display panel DP or DP-1 (see FIG. 7A) and that emit a red light. The fluorescent bodies or phosphors for the red light may be formed of, or may include, at least one of, for example, (Ca, Sr, Ba)S, (Ca, Sr, Ba)$_2$Si$_5$N$_8$, CaAlSiN$_3$, CaMoO$_4$, or Eu$_2$Si$_5$N$_8$.

The third control pattern CP3 may include a plurality of fluorescent bodies or phosphors that absorb a blue light provided from the organic light emitting device OLED and that emit a green light. The fluorescent bodies or phosphors for the green light may be formed of, or may include, at least one of, for example, yttrium aluminum garnet (YAG), (Ca, Sr, Ba)$_2$SiO$_4$, SrGa$_2$S$_4$, BAM, α-SiAlON, β-SiAlON), Ca$_3$Sc$_2$Si$_3$O$_{12}$, Tb$_3$Al$_5$O$_{12}$, BaSiO$_4$, CaAlSiON, or (Sr1-xBax)Si$_2$O$_2$N$_2$.

The inorganic cover layer CIOL may be located on the color control layer CP. The inorganic cover layer CIOL may cover the color control layer CP and portions of the color filter layer CC that are exposed through the color control layer CP. The inorganic cover layer CIOL may delimit the first to third control patterns CP1, CP2, and CP3. The inorganic cover layer CIOL may be formed of, or may include, at least one of silicon nitride, silicon oxide, or compounds thereof.

The inorganic cover layer CIOL may cover the color control layer CP and thus may reduce or prevent external moisture and oxygen from entering the color control layer CP.

The organic cover layer COL may be located on the inorganic cover layer CIOL. The organic cover layer COL may be provided to have a flat surface. The organic cover layer COL may cover particles or the like that are present on the inorganic cover layer CIOL, and thus, elements, which are formed on the organic cover layer COL, may be prevented from being affected by a surface state of the inorganic cover layer CIOL. Thus, the cover panel CU and the refraction control layer RCL may be uniformly combined with each other when they are attached together. In addition, the organic cover layer COL may relieve stress between layers that are in contact with each other. The organic cover layer COL may include an organic material and may be formed by a solution process, such as a spin coating process, a slit coating process, and an inkjet process.

FIG. 4B illustrates the pixels PX, which are overlapped with the third to fifth light-emitting regions PXA3, PXA4, and PXA5 of FIG. 3, and elements, which are located on the pixels PX.

In an embodiment, each of the first refraction patterns RL1 may extend in the second direction D2. Thus, each of the first refraction patterns RL1 may be fully overlapped with the light-emitting regions PXA3, PXA4, and PXA5 arranged in the second direction D2.

The light-emitting regions PXA3, PXA4, and PXA5 extending in the second direction D2 may overlap one of the first refraction patterns RL1. In the case where lights are provided from the light-emitting regions PXA3, PXA4, and PXA5 located on the same row, the lights may have the same color due to the fact that the first refraction pattern RL1, the third control pattern CP3, and the third color pattern CC3, which are located on propagation paths of the lights, are the same for each of the light-emitting regions PXA3, PXA4, and PXA5.

Referring to FIG. 5, each of the first refraction patterns RL1 according to an embodiment of the present disclosure may include a bottom portion RB, which is located on the encapsulation layer ECL, an upper portion RU, which is opposite to the bottom portion RB and is adjacent to the organic cover layer COL, and a side portion RS, which connects the upper portion RU to the bottom portion RB and which forms a boundary to/with the second refraction pattern RL2.

In an embodiment, an angle θ between the bottom portion RB and the side portion RS may be an acute angle. Thus, each of the first refraction patterns RL1 may have a trapezoidal shape when viewed in a section view/cross-sectional view parallel to the first and third directions D1 and D3. In addition, the second refraction pattern RL2, which is located between each adjacent pair of the first refraction patterns RL1, may have an inverse-trapezoidal shape.

When measured in the first direction D1, the largest width of each of the first refraction patterns RL1 may correspond to a lower width R1. When measured in the first direction D1, the smallest width of each of the first refraction patterns RL1 may correspond to an upper width R2. An area of the bottom portion RB of each of the first refraction patterns RL1 may be larger than an area of the upper portion RU.

In an embodiment, the light-emitting pattern EP may have a first width L1 in the first direction D1. According to an embodiment of the present disclosure, the largest width (i.e., the lower width R1) of each of the first refraction patterns RL1 may be larger than the first width L1 of the light-emitting pattern EP.

In an embodiment, each of the control patterns CP1, CP2, and CP3 (CP1 being omitted from FIG. 5) may have a second width L2 in the first direction D1. According to an embodiment of the present disclosure, the smallest width (i.e., the upper width R2) of each of the first refraction patterns RL1 may be larger than the second width L2.

The first refraction patterns RL1 and the second refraction pattern RL2 may have refractive indices that are different from each other. For example, each of the first refraction patterns RL1 may have a refractive index that is higher than that of the second refraction pattern RL2. In addition, a difference in refractive index between each of the first refraction patterns RL1 and the second refraction pattern RL2 may be equal to or larger than 0.05.

In an embodiment, each of elements, which are located on a propagation path of light from the light-emitting pattern EP to the color filter layer CC, may have sequentially-increasing refractive indices. For example, in an embodiment, light provided from the light-emitting pattern EP may be incident into the color filter layer CC (e.g., see FIG. 4A) through the encapsulation layer ECL, the first refraction patterns RL1, the organic cover layer COL, and the inorganic cover layer CIOL, and in this case, refractive indices of the encapsulation layer ECL, the first refraction patterns RL1, the organic cover layer COL, and the inorganic cover layer CIOL may increase in the order listed.

In an embodiment, the refraction control layer RCL may have a thickness TH ranging from about 5 μm to about 100 μm. In the case where a thickness of each of the first refraction patterns RL1 is less than about 5 μm, an area of the side portion RS, where the total reflection of light incident to the first refraction patterns RL1 occurs, may be decreased, and thus, the light incident to the first refraction patterns RL1 may be incident into the control patterns CP1, CP2, and CP3 adjacent thereto, and in this case, a color mixing issue may occur.

In the case where the thickness TH of the refraction control layer RCL is larger than about 100 μm, a path of light passing through the refraction control layer RCL may be increased, and in this case, a light loss issue may occur.

According to an embodiment of the present disclosure, even if the first width L1 of the light-emitting pattern EP is increased, it may be possible to increase light-emitting efficiency and life span of the light-emitting pattern EP, because the bottom portion RB of the first refraction pattern RL1 has a width larger than the first width L1. Furthermore, even if the first width L1 of the light-emitting pattern EP is increased, it may be possible to reduce or prevent light, which is provided from the light-emitting pattern EP, from being refracted between the first refraction patterns RL1 and the second refraction pattern RL2, and thus from being incident into the light-emitting regions PXA adjacent thereto.

According to an embodiment of the present disclosure, each of the first refraction patterns RL1 may have a refractive index that is higher than that of the second refraction pattern RL2, and thus, light, which is provided to each of the first refraction patterns RL1, may be totally reflected from an interface between the first refraction patterns RL1 and the second refraction pattern RL2. Thus, it may be possible to reduce or prevent the loss of light that is incident into the refraction control layer RCL.

Furthermore, a width M2 of the light-blocking layer ABM in the first direction D1 may be larger than an upper width M1 of the second refraction pattern RL2 between the upper portions RU of the first refraction patterns RL1. Thus, it may be possible to reduce or prevent lights of different colors from being mixed with each other.

Figure 6A:
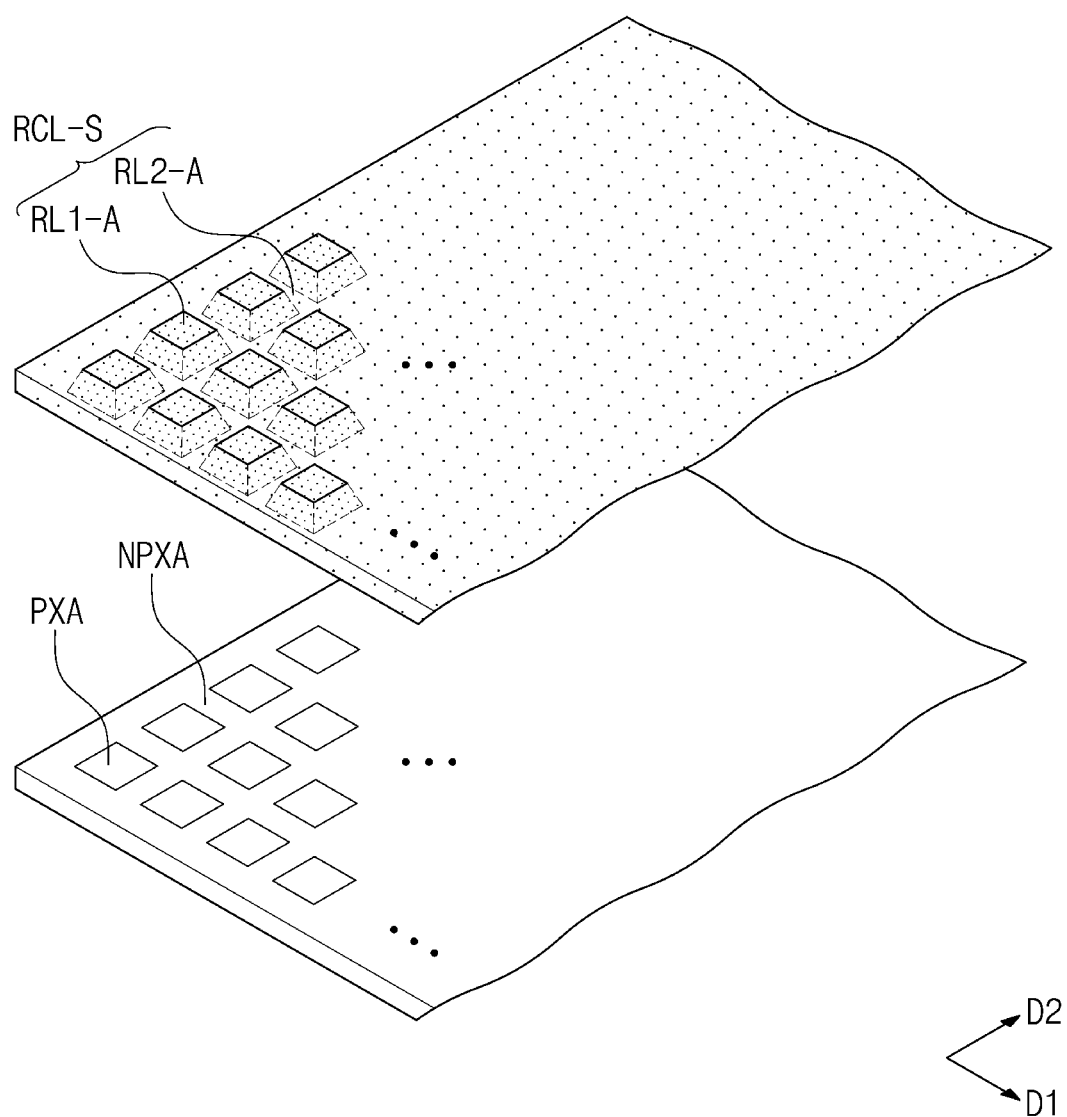
FIG. 6A is an exploded perspective view illustrating some elements of an electronic apparatus according to an embodiment of the present disclosure.
Figure 6B:
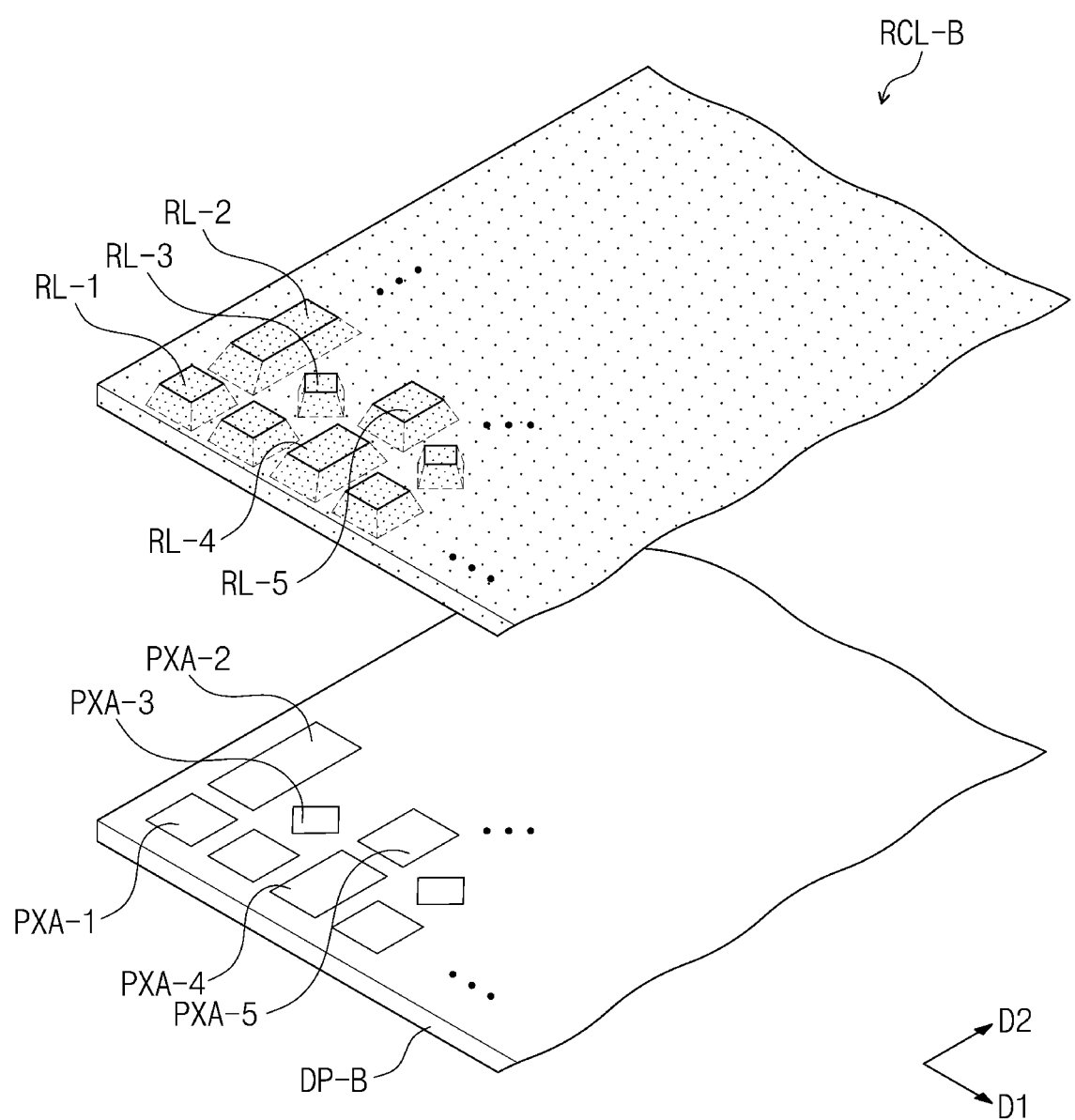
FIG. 6B is an exploded perspective view illustrating some elements of an electronic apparatus according to an embodiment of the present disclosure.

FIG. 6A is an exploded perspective view illustrating some elements of an electronic apparatus according to an embodiment of the present disclosure. FIG. 6B is an exploded perspective view illustrating some elements of an electronic apparatus according to an embodiment of the present disclosure. For concise description, an element previously described with reference to FIGS. 1 to 5 may be identified by the same reference number without repeating an overlapping description thereof.

Referring to FIG. 6A, in a refraction control layer RCL-S according to an embodiment of the present disclosure, the first refraction patterns RL1-A may be spaced apart from each other (in the first direction D1 and the second direction D2) with a second refraction pattern RL2-A interposed therebetween.

Each of the first refraction patterns RL1-A may overlap a corresponding one of the light-emitting regions PXA in a one-to-one manner. Each of the first refraction patterns RL1-A may have a frustum shape. For example, each of the first refraction patterns RL1-A may have a frustum shape including a bottom surface adjacent to the light-emitting regions PXA, a top surface, which is opposite to the bottom surface and has an area that is smaller than that of the bottom surface, and one or more side surfaces connecting the top surface to the bottom surface. The first refraction patterns RL1-A may be island-shaped patterns that are spaced apart from each other in the first direction D1 and the second direction D2. The second refraction pattern RL2-A may be located between the first refraction patterns RL1-A, which are spaced apart from each other in the first direction D1 and the second direction D2.

Referring to FIG. 6B, a display panel DP-B according to an embodiment of the present disclosure may include the light-emitting regions PXA-1, PXA-2, PXA-3, PXA-4, and PXA-5, which may have different shapes from each other.

A refraction control layer RCL-B may include first refraction patterns RL-1, RL-2, RL-3, RL-4, and RL-5, which are spaced apart from each other with the second refraction pattern RL2 interposed therebetween. Each of the first refraction patterns RL-1, RL-2, RL-3, RL-4, and RL-5 of the refraction control layer RCL-B may have a frustum shape. For example, the first refraction patterns RL-1, RL-2, RL-3, RL-4, and RL-5 may have a frustum shape including a bottom surface, which is adjacent to the light-emitting regions PXA-1, PXA-2, PXA-3, PXA-4, and PXA-5, a top surface, which is opposite to the bottom surface and has an area that is smaller than the bottom surface, and side surfaces connecting the top surface to the bottom surface.

In an embodiment, the bottom surfaces of the first refraction patterns RL-1, RL-2, RL-3, RL-4, and RL-5 may have shapes that are different from each other. The shapes of the bottom surfaces of each of the first refraction patterns RL-1, RL-2, RL-3, RL-4, and RL-5 may respectively correspond to the shapes of the light-emitting regions PXA-1, PXA-2, PXA-3, PXA-4, and PXA-5 overlapped with them.

However, the present disclosure is not limited to this example. For example, the shapes of the first refraction patterns may be variously changed in other embodiments wherein the first refraction patterns are spaced apart from each other and have a frustum shape whose bottom and top surfaces have shapes corresponding to that of a light-emitting region overlapped with the same.

Figure 7A:
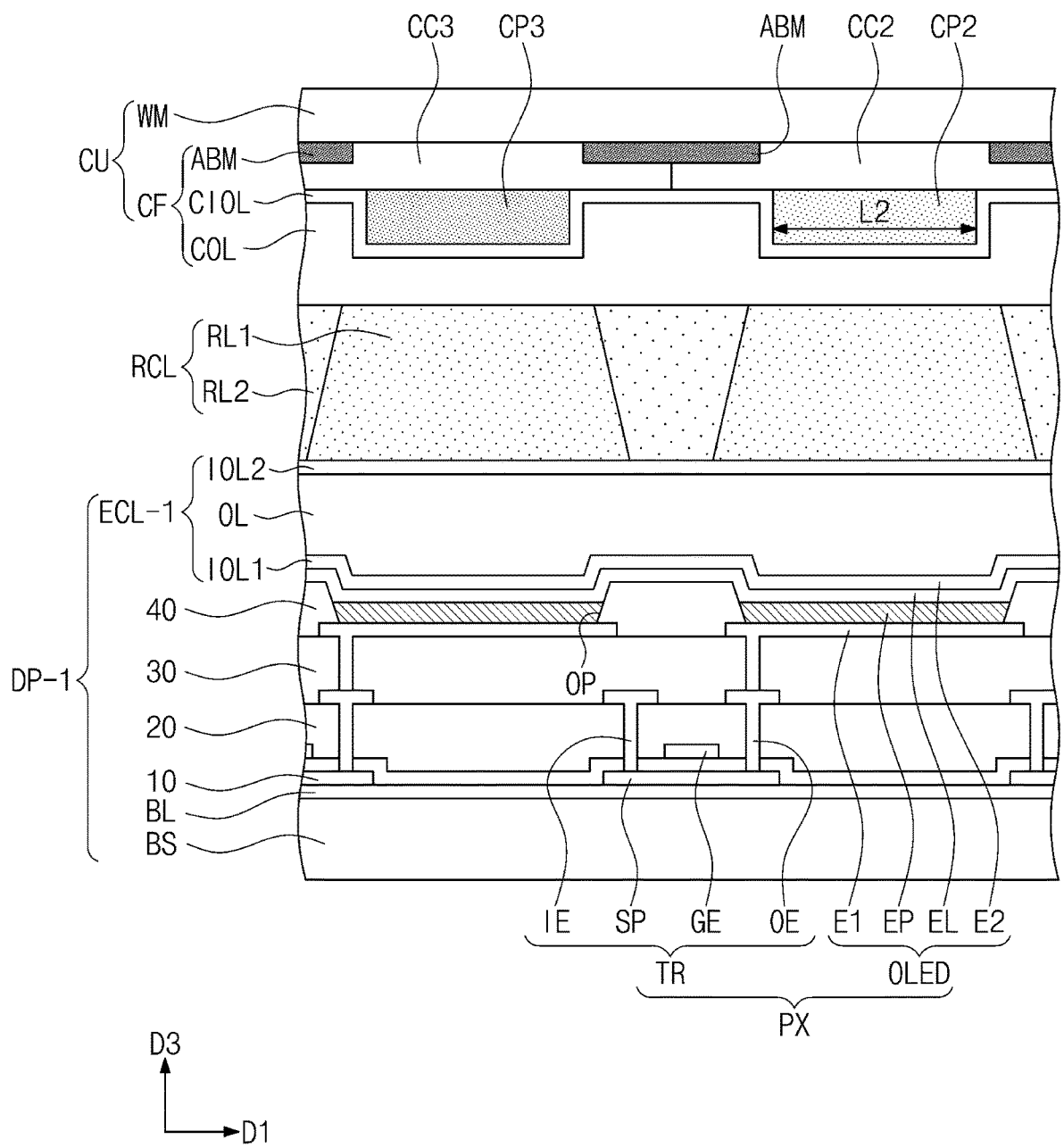
FIG. 7A is a sectional view illustrating some elements of an electronic apparatus according to an embodiment of the present disclosure.
Figure 7B:
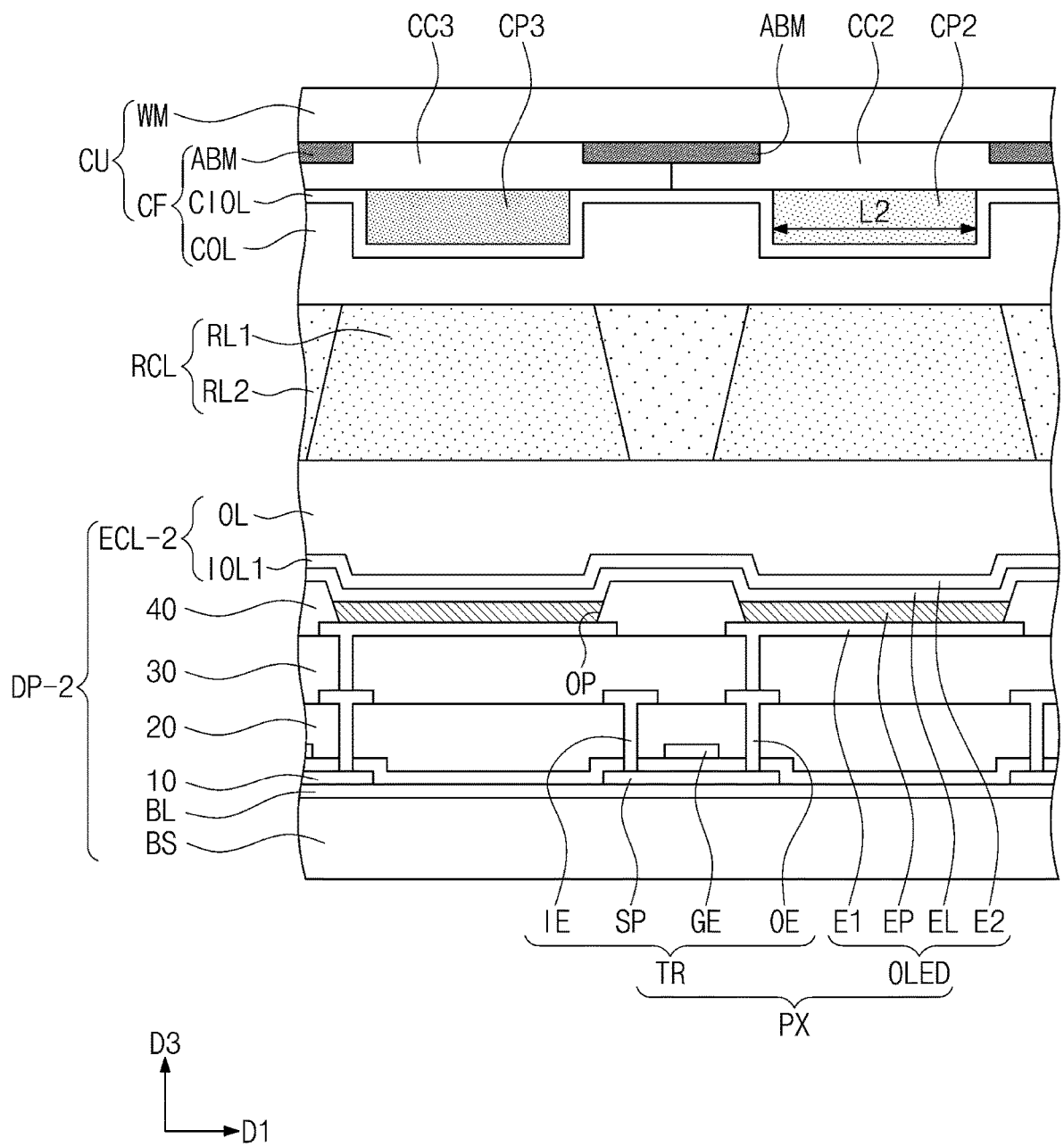
FIG. 7B is a sectional view illustrating some elements of an electronic apparatus according to an embodiment of the present disclosure.

FIG. 7A is a sectional view illustrating some elements of an electronic apparatus according to an embodiment of the present disclosure. FIG. 7B is a sectional view/cross-sectional view illustrating some elements of an electronic apparatus according to an embodiment of the present disclosure. For concise description, an element previously described with reference to FIGS. 1 to 5 may be identified by the same reference number without repeating an overlapping description thereof.

In an embodiment, the display panel DP-1 may include an encapsulation layer ECL-1 covering the pixels PX. The encapsulation layer ECL-1 may include a first inorganic encapsulation layer IOL1, an organic encapsulation layer OL, and a second inorganic encapsulation layer IOL2, which are sequentially stacked in the third direction D3. However, the present disclosure is not limited to this example, and in an embodiment, the encapsulation layer ECL-1 may further include at least one of inorganic or organic layers.

The first inorganic encapsulation layer IOL1 may cover the second electrode E2. The first inorganic encapsulation layer IOL1 may reduce or prevent external moisture or oxygen from entering the organic light emitting device OLED. For example, the first inorganic encapsulation layer IOL1 may be formed of, or may include, at least one of silicon nitride, silicon oxide, or compounds thereof. The first inorganic encapsulation layer IOL1 may be formed by a deposition process.

The organic encapsulation layer OL may be located on the first inorganic encapsulation layer IOL1 and may be in contact with the first inorganic encapsulation layer IOL1. The organic encapsulation layer OL may have a flat top surface, and may be located on the first inorganic encapsulation layer IOL1. The organic encapsulation layer OL may cover the first inorganic encapsulation layer IOL1 having an uneven top surface, or may cover particles on the first inorganic encapsulation layer IOL1, and this may make it possible to reduce or prevent an uneven surface profile of the first inorganic encapsulation layer IOL1 or the particles from affecting elements or layers to be formed on the organic encapsulation layer OL.

In addition, the organic encapsulation layer OL may relieve stress between layers that are in contact with each other. The organic encapsulation layer OL may include an organic material, and may be formed by a solution process, such as a spin coating process, a slit coating process, and an inkjet process.

The second inorganic encapsulation layer IOL2 may be located on the organic encapsulation layer OL to cover the organic encapsulation layer OL. By virtue of the organic encapsulation layer OL having a relatively flat top surface, it may be possible to more stably form the second inorganic encapsulation layer IOL2, as compared to a case wherein the second inorganic encapsulation layer IOL2 would be formed on the first inorganic encapsulation layer IOL1. The second inorganic encapsulation layer IOL2 may encapsulate the organic encapsulation layer OL, and may reduce or prevent moisture in the organic encapsulation layer OL from being leaked to the outside. The second inorganic encapsulation layer IOL2 may be formed of, or may include, at least one of silicon nitride, silicon oxide, or compounds thereof. The second inorganic encapsulation layer IOL2 may be formed by a deposition process.

The refraction control layer RCL may be located on the encapsulation layer ECL-1. For example, the refraction control layer RCL may be directly located on the second inorganic encapsulation layer IOL2.

According to an embodiment of the present disclosure, because the refraction control layer RCL is located on the encapsulation layer ECL-1 including the organic encapsulation layer OL, light provided from the display panel DP-1 may be uniformly incident into the refraction control layer RCL without influence from an uneven top surface of the first inorganic encapsulation layer IOL1 or from particles on the first inorganic encapsulation layer IOL1. Thus, the electronic apparatus EA (e.g., see FIG. 4A) may be provided with improved optical efficiency.

Referring to FIG. 7B, in an encapsulation layer ECL-2 according to an embodiment of the present disclosure, the second inorganic encapsulation layer 10L2 covering the organic encapsulation layer OL may be omitted, unlike the encapsulation layer ECL-1 of FIG. 7A. Thus, the refraction control layer RCL may be directly located on the organic encapsulation layer OL.

Because the second inorganic encapsulation layer IOL2 including an inorganic material is omitted, it may be possible to easily control a difference in refractive index between the display panel DP-2 and the refraction control layer RCL, which are in contact with each other.

Figure 9:
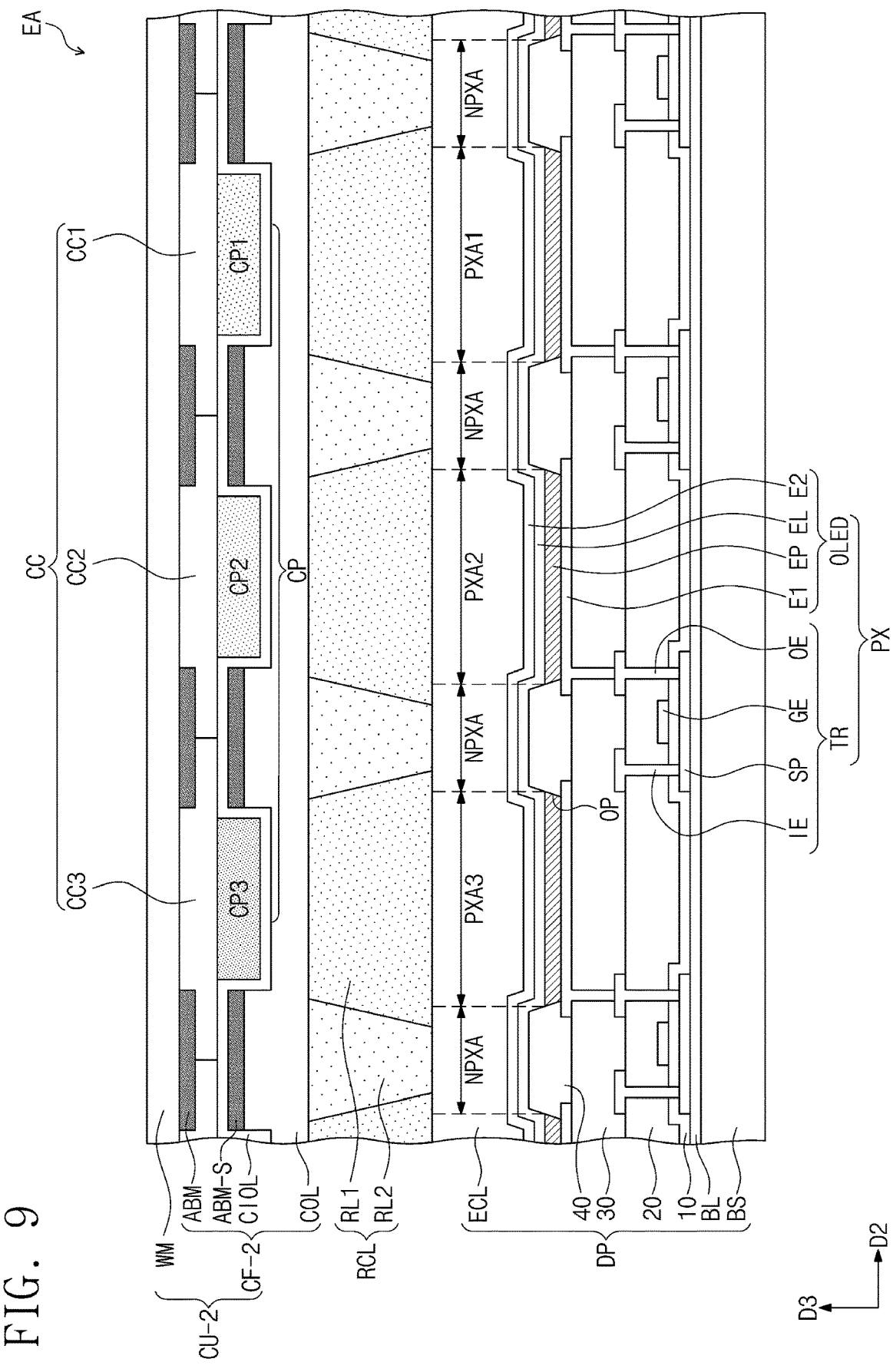
FIG. 9 is a sectional view illustrating an electronic apparatus according to an embodiment of the present disclosure.

FIG. 8 is a sectional view illustrating an electronic apparatus according to an embodiment of the present disclosure. FIG. 9 is a sectional view illustrating an electronic apparatus according to an embodiment of the present disclosure. For concise description, an element previously described with reference to FIGS. 1 to 5 may be identified by the same reference number without repeating an overlapping description thereof.

In an embodiment, a cover panel CU-1 may include the window layer WM and an optical layer CF-1. The optical layer CF-1 may include a partition wall layer WA, the color filter layer CC, the light-blocking layer ABM, and the color control layer CP, which are located to be overlapped with the transmission region TA (e.g., see FIG. 2).

The partition wall layer WA may be located on the rear surface of the window layer WM. The partition wall layer WA may be located on the rear surface of the window layer WM to reduce or prevent elements of a display panel DP from being recognized by light incident from the outside to the window layer WM. The partition wall layer WA may include a light-blocking organic material. The partition wall layer WA may have a color (e.g., a predetermined color). For example, the partition wall layer WA may be blue.

Openings may be defined in the partition wall layer WA. At least a portion of the rear surface of the window layer WM may be exposed through the openings of the partition wall layer WA. Each of the openings may overlap a corresponding one of the light-emitting regions PXA1, PXA2, and PXA3 of the display panel DP. In an embodiment, the first color pattern CC1 may include the same material as the partition wall layer WA, and may have the same color as the partition wall layer WA. In an embodiment, the partition wall layer WA may overlap the first light-emitting region PXA1, and in this case, the first color pattern CC1 may be omitted.

The light-blocking layer ABM may be located over the partition wall layer WA. The light-blocking layer ABM may be located between the light-emitting regions PXA1, PXA2, and PXA3 to absorb lights propagating toward light-emitting regions different from each other.

Referring to FIG. 9, a cover panel CU-2 according to an embodiment of the present disclosure may include the window layer WM and an optical layer CF-2. The optical layer CF-2 may include the color filter layer CC, the light-blocking layer ABM, the color control layer CP, and an additional light-blocking layer ABM-S.

The additional light-blocking layer ABM-S may be located on the inorganic cover layer CIOL. For example, the additional light-blocking layer ABM-S may be located between portions of the inorganic cover layer CIOL, which delimits the first to third control patterns CP1, CP2, and CP3, and may overlap the non-light-emitting region NPXA. The additional light-blocking layer ABM-S may be covered with the organic cover layer COL. That is, the additional light-blocking layer ABM-S may be located between the organic cover layer COL and the inorganic cover layer CIOL.

The additional light-blocking layer ABM-S may include the same material as the light-blocking layer ABM. For example, the additional light-blocking layer ABM-S may include an optically opaque material. For example, the additional light-blocking layer ABM-S may include at least one of metallic particles whose metallic element includes at least one of chromium (Cr), silver (Ag), molybdenum (Mo), nickel (Ni), titanium (Ti), or tantalum (Ta), oxides of the metallic particles, or organic materials.

The additional light-blocking layer ABM-S may reduce or prevent lights, which are provided from the refraction control layer RCL to the first to third control patterns CP1, CP2, and CP3, from being mixed with each other. In addition, the additional light-blocking layer ABM-S may absorb light, which is leaked to ones of the first to third control patterns CP1, CP2, and CP3 adjacent thereto, and this may make it possible to improve reliability of the electronic apparatus EA.

FIGS. 10A to 10G are diagrams illustrating a method of fabricating a refraction control layer, according to an embodiment of the present disclosure. For concise description, an element previously described with reference to FIGS. 1 to 5 may be identified by the same reference number without repeating an overlapping description thereof. Hereinafter, a method of fabricating a refraction control layer, according to an embodiment of the present disclosure, will be described with reference to FIGS. 10A to 10G.

Figure 10A:
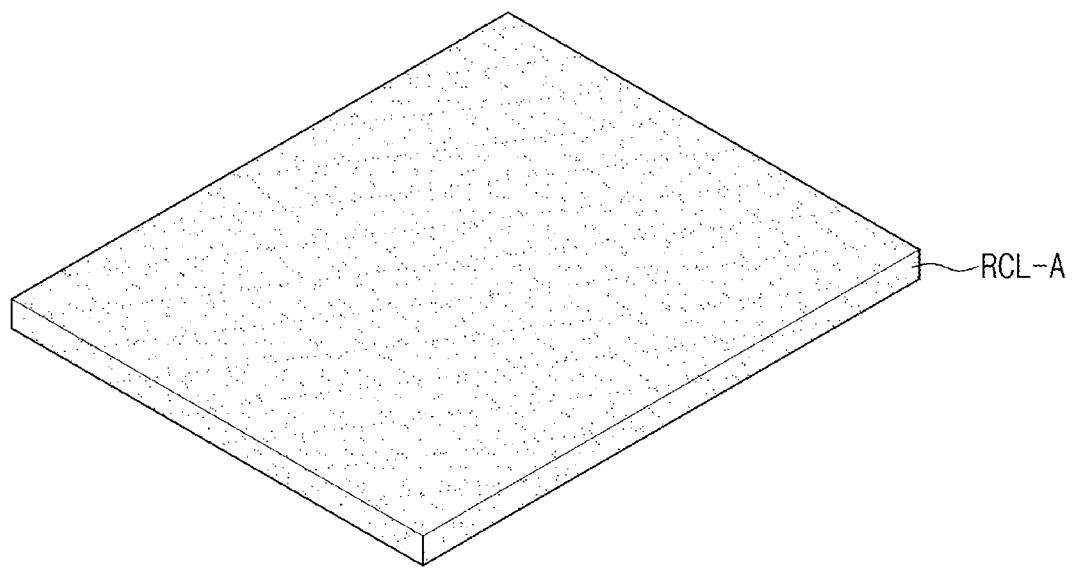
FIGS. 10A to 10G are diagrams illustrating a method of fabricating a refraction control layer, according to an embodiment of the present disclosure.

Referring to FIG. 10A, the method of fabricating a refraction control layer may include providing a preliminary refraction control layer RCL-A. The preliminary refraction control layer RCL-A may include a photo-sensitive resin, in which materials of different refractive indices are contained. For example, the preliminary refraction control layer RCL-A may be a photo-sensitive resin, in which a highly refractive material, a barely refractive material, a photo-initiator, and an UV absorber are mixed. The highly refractive material may include ethoxylated o-phenylphenol acrylate. The barely refractive material may include urethane methacrylate oligomer.

Figure 10B:
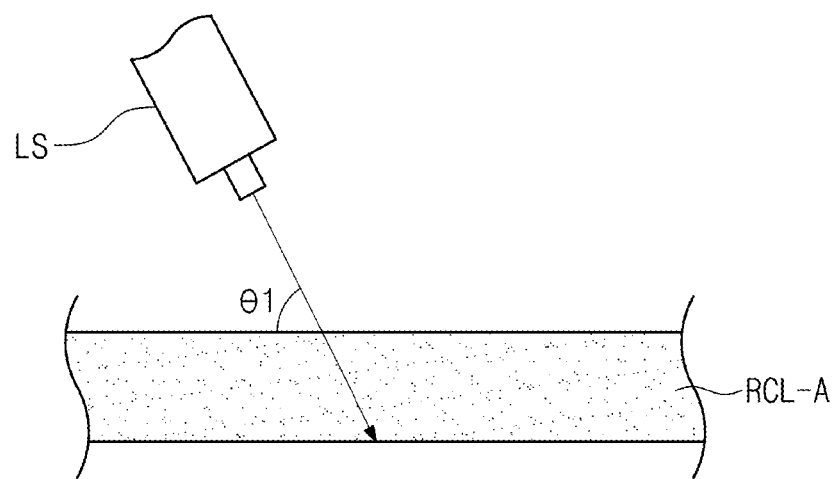
Figure 10C:
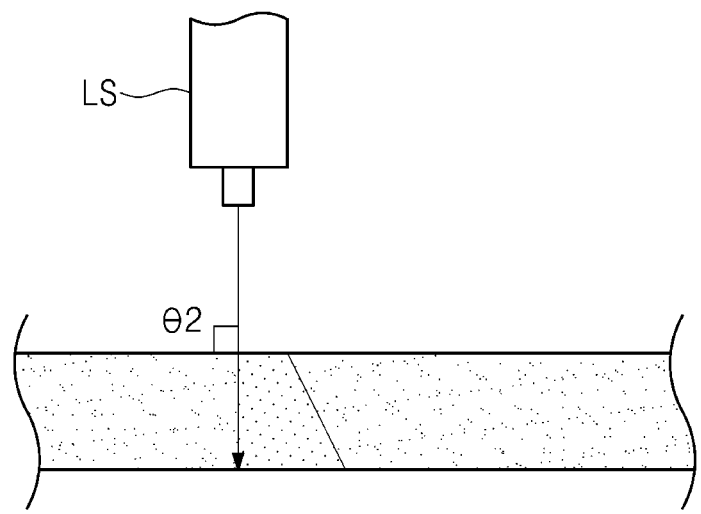
Figure 10D:
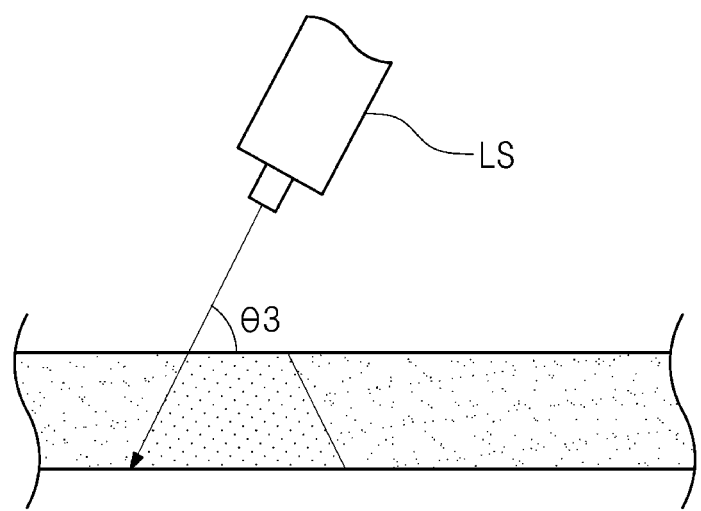

Thereafter, as shown in FIGS. 10B to 10D, light may be irradiated onto the preliminary refraction control layer RCL-A. The irradiation of the light may include sequentially irradiating ultraviolet (UV) light onto the preliminary refraction control layer RCL-A at first to third angles θ1 to θ3 using a plate-shaped light source LS.

Each of the first to third angles θ1 to θ3 may be an angle between the preliminary refraction control layer RCL-A and the UV light emitted from the plate-shaped light source LS.

In the case where light is irradiated to the preliminary refraction control layer RCL-A at the first to third angles θ1 to θ3, a highly refractive material may cohere in an exposed region, and a barely refractive material may cohere in an unexposed region, due to the photo-initiator included in the preliminary refraction control layer RCL-A.

Figure 10E:
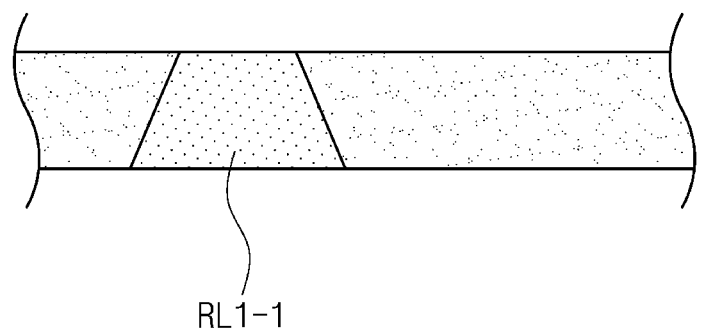

Referring to FIG. 10E, a first refraction pattern RL1-1, which is made of the highly refractive material, may be formed in a region of the preliminary refraction control layer RCL-A, to which lights are irradiated at the first to third angles θ1 to θ3.

Figure 10F:
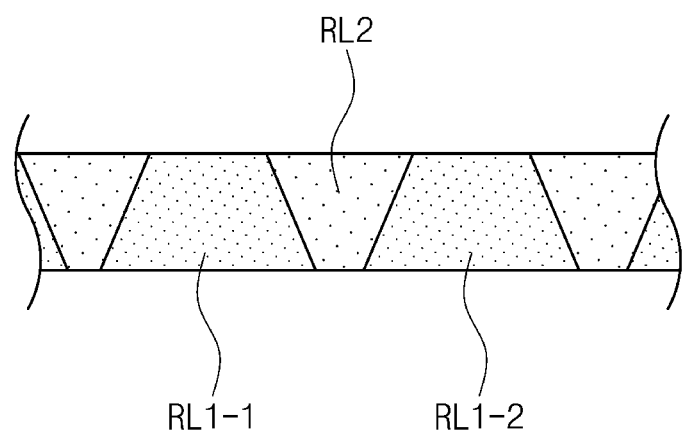

Referring to FIG. 10F, a region, which is spaced apart from the first refraction pattern RL1-1, may be irradiated at the first to third angles θ1 to θ3 with the plate-shaped light source LS (e.g., see FIGS. 10B-10D), and thus, a first refraction pattern RL1-2, which is made of the highly refractive material, may be formed in the region.

Figure 10G:
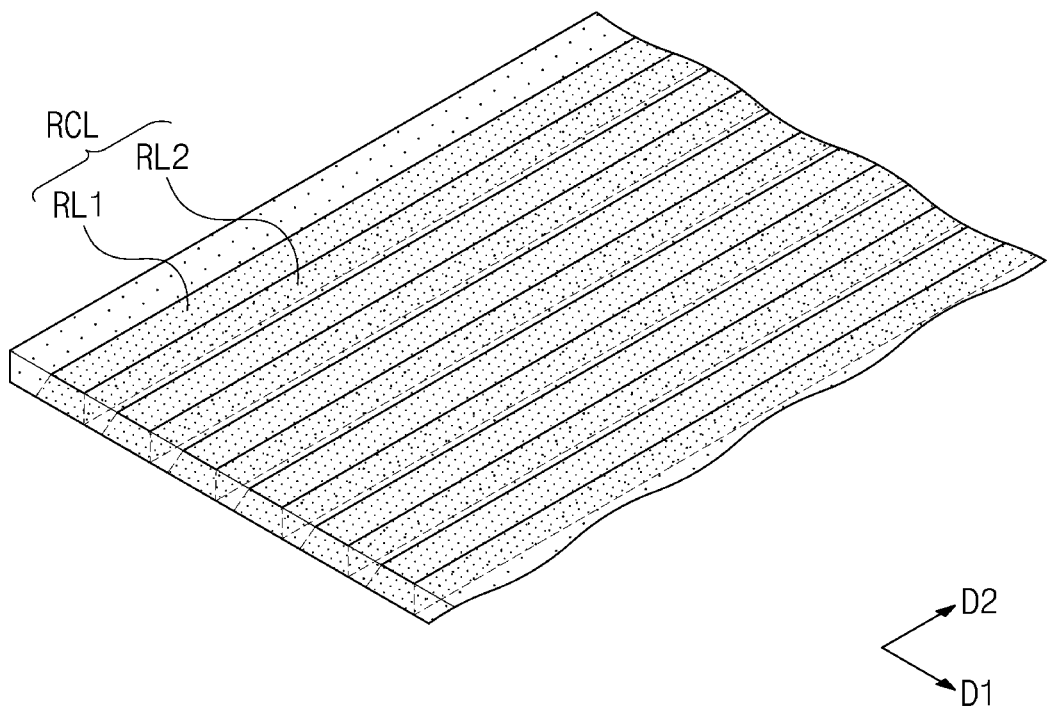

Referring to FIG. 10G, the process of irradiating the light may be repeated to form the first refraction patterns RL1, which are spaced apart from each other in the first direction D1 and are extended in the second direction D2. The second refraction pattern(s) RL2 may be formed between each adjacent pair of the first refraction patterns RL1.

According to an embodiment of the present disclosure, a refraction control layer, which is located between a display panel and a cover panel, may include patterns of different refractive indices. A pattern of a relatively high refractive index may overlap light-emitting regions of the display panel, and in this case, it may be possible to reduce or prevent a light mixing issue, which is otherwise caused by a space between the display panel and the cover panel. Thus, an electronic apparatus with improved reliability may be provided.

While embodiments of the present disclosures have been particularly shown and described, it will be understood by one of ordinary skill in the art that variations in form and detail may be made therein without departing from the spirit and scope of the attached claims, with functional equivalents thereof to be included therein.

What is claimed is:

1. An electronic apparatus comprising:
 a display panel comprising a base substrate, a pixel definition layer on the base substrate to define openings, light-emitting devices comprising light-emitting patterns in the openings, and an encapsulation layer covering the light-emitting device;
 a cover panel on the display panel and comprising a window layer, a color filter layer, and a color control layer, the window layer comprising a rear surface facing the display panel and a front surface opposite to the rear surface, the color filter layer being on the rear surface, the color control layer being on the color filter layer and comprising a quantum dot; and
 a refraction control layer between the display panel and the cover panel, the refraction control layer comprising first refraction patterns, which overlap the light-emitting patterns, respectively, and which have a first refractive index, and a second refraction pattern, which is adjacent to the first refraction patterns, and which has a second refractive index that is lower than the first refractive index,
 wherein each of the first refraction patterns comprises an upper portion, which is adjacent to the color control layer, a bottom surface, which is opposite to the upper portion and contacts the encapsulation layer, and a side portion, which connects the upper portion to the bottom surface and forms a boundary to the second refraction pattern
 wherein, when measured in a first direction, a width of each of the bottom surfaces of the first refraction patterns is larger than a width of upper surfaces of each of the light-emitting patterns.

2. The electronic apparatus of claim 1, wherein the light-emitting patterns are spaced apart from each other in the first direction, and in a second direction crossing the first direction, and
 wherein each of the first refraction patterns overlaps some of the light-emitting patterns, which are arranged in the second direction.

3. The electronic apparatus of claim 2, wherein each of the first refraction patterns extends in the second direction, and wherein the first and second refraction patterns are arranged alternately in the first direction.

4. The electronic apparatus of claim 2, wherein the first refraction patterns are spaced apart from each other in the first and second directions with the second refraction pattern interposed therebetween.

5. The electronic apparatus of claim 2, wherein the color control layer comprises first to third control patterns that extend in the second direction, that are spaced apart from each other in the first direction, and that respectively overlap the first refraction patterns, and
 wherein, when measured in the first direction, a smallest width of each of the first refraction patterns is larger than a width of each of the first to third control patterns.

6. The electronic apparatus of claim 5, wherein the display panel comprises light-emitting regions overlapping the light-emitting patterns, and a non-light-emitting region adjacent to the light-emitting regions, and
 wherein the cover panel comprises a light-blocking layer, which is on the rear surface and overlaps the non-light-emitting region, an inorganic cover layer, which delimits the first to third control patterns, and an organic cover layer, which is on the inorganic cover layer and contacts the refraction control layer.

7. The electronic apparatus of claim 6, wherein the inorganic cover layer has a third refractive index,
 wherein the organic cover layer has a fourth refractive index that is lower than the third refractive index, and wherein the first refractive index is lower than the fourth refractive index.

8. The electronic apparatus of claim 6, wherein the cover panel further comprises an additional light-blocking layer that is between portions of the inorganic cover layer delimiting the first to third control patterns, that overlaps the non-light-emitting region, and that contacts the organic cover layer.

9. The electronic apparatus of claim 1, wherein an angle between the bottom surface and the side portion is an acute angle.

10. The electronic apparatus of claim 9, wherein an area of the bottom surface is larger than an area of the upper portion.

11. The electronic apparatus of claim 1, wherein, when viewed in a cross-sectional view taken along the first direction, each of the first refraction patterns has a trapezoidal shape, and the second refraction pattern adjacent to the first refraction patterns has an inverse-trapezoidal shape.

12. The electronic apparatus of claim 1, wherein a difference between the first refractive index and the second refractive index is equal to or larger than about 0.05.

13. The electronic apparatus of claim 1, wherein the encapsulation layer comprises at least one inorganic encapsulation layer, and an organic encapsulation layer contacting the inorganic encapsulation layer, and
wherein the refraction control layer contacts one of the inorganic encapsulation layer and the organic encapsulation layer.

14. The electronic apparatus of claim 1, wherein the refraction control layer has a thickness ranging from about 5 µm to about 100 µm.

15. An electronic apparatus, comprising:
a display panel comprising a base substrate, light-emitting patterns comprising light-emitting devices on the base substrate, and an encapsulation layer covering the light-emitting devices;
a cover panel on the display panel and comprising a window layer, which comprises a rear surface facing the display panel and a front surface opposite to the rear surface, a color filter layer, which is on the rear surface, and a color control layer, which is on the color filter layer and comprises a quantum dot; and
a refraction control layer on the encapsulation layer and comprising first refraction patterns, which respectively overlap the light-emitting patterns and have a refractive index, and a second refraction pattern, which is adjacent to the first refraction patterns and has a refractive index that is lower than the refractive index of the first refraction patterns,
wherein each of the first refraction patterns comprises a bottom surface on the encapsulation layer, an upper portion opposite to the bottom surface, and a side portion connecting the upper portion to the bottom surface and forming a boundary with the second refraction pattern, and
wherein, when measured in a first direction, a width of the bottom surface is larger than a width of an upper surface of one of the light-emitting patterns overlapping the bottom surface.

16. The electronic apparatus of claim 15, wherein an angle between the bottom surface and the side portion is an acute angle.

17. The electronic apparatus of claim 15, wherein an area of the bottom surface is larger than an area of the upper portion.

18. The electronic apparatus of claim 17, wherein the color control layer comprises first to third control patterns that extend in a second direction crossing the first direction, that are spaced apart from each other in the first direction, and that respectively overlap the first refraction patterns, and
wherein, when measured in the first direction, a width of the upper portion is larger than a width of each of the first to third control patterns.

19. The electronic apparatus of claim 18, wherein the display panel comprises a light-emitting region overlapping the light-emitting patterns, and a non-light-emitting region adjacent to the light-emitting region,
wherein the cover panel comprises a light-blocking layer, which is on the rear surface of the window layer and overlaps the non-light-emitting region, an inorganic cover layer, which delimits the first to third control patterns, and an organic cover layer, which is on the inorganic cover layer and contacts the refraction control layer, and
wherein refractive indices of the encapsulation layer, first refraction pattern, the organic cover layer, and the inorganic cover layer increase in order listed.

20. The electronic apparatus of claim 15, wherein each of the first refraction patterns has a frustum shape.

21. An electronic apparatus, comprising:
a display panel comprising a base substrate, a pixel definition layer on the base substrate to define openings, light-emitting patterns comprising light-emitting devices in the openings, and an encapsulation layer covering the light-emitting devices;
a cover panel comprising a window layer on the display panel, a color filter layer on the window layer, and a color control layer on the color filter layer and comprising a quantum dot; and
a refraction control layer on the encapsulation layer and comprising first refraction patterns, which respectively overlap the light-emitting patterns and have a first refractive index, and a second refraction pattern, which is adjacent to the first refraction patterns and has a second refractive index that is lower than the first refractive index,
wherein the light-emitting patterns are spaced apart from each other in a first direction and in a second direction crossing each other, and
wherein each of the first refraction patterns overlaps corresponding ones of the light-emitting patterns arranged in the second direction and a portion of the pixel definition layer disposed between the corresponding ones of the light-emitting patterns in the second direction.

22. The electronic apparatus of claim 21, wherein, when measured in the first direction, a largest width of each of the first refraction patterns is larger than a width of a respective one of the light-emitting patterns.

23. The electronic apparatus of claim 21, wherein the color control layer comprises first to third control patterns that extend in the second direction, that are spaced apart from each other in the first direction, and that overlap the first refraction patterns, and
wherein, when measured in the first direction, a smallest width of each of the first refraction patterns is larger than a width of each of the first to third control patterns.

24. The electronic apparatus of claim 21, wherein each of the first refraction patterns comprises an upper portion adjacent to the color control layer, a bottom surface opposite to the upper portion and contacting the encapsulation layer, and a side portion connecting the upper portion to the bottom surface and forming a boundary with the second refraction pattern, and wherein an angle between the bottom surface and the side portion is an acute angle.

25. The electronic apparatus of claim 24, wherein an area of the bottom surface is larger than an area of the upper portion.

\* \* \* \* \*